US008176234B2

(12) United States Patent  
Franceschini et al.

(10) Patent No.: US 8,176,234 B2  
(45) Date of Patent: May 8, 2012

(54) MULTI-WRITE CODING OF NON-VOLATILE MEMORIES

(75) Inventors: Michele M. Franceschini, Yorktown Heights, NY (US); Ashish Jagmohan, Yorktown Heights, NY (US); Luis A. Lastras-Montano, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 12/631,470

(22) Filed: Dec. 4, 2009

(65) Prior Publication Data

US 2011/0138104 A1 Jun. 9, 2011

(51) Int. Cl.  
*G06F 12/00* (2006.01)

(52) U.S. Cl. ........ 711/103; 711/156; 711/158; 711/209; 365/185.33; 707/813; 707/814; 707/817

(58) Field of Classification Search .................. 711/103, 711/156, 158, 209; 365/185.33; 707/813, 707/814, 817  
See application file for complete search history.

(56) References Cited

U.S. PATENT DOCUMENTS

| | | | |
|---|---|---|---|
| 6,157,570 A | 12/2000 | Nachumovsky | |
| 6,640,319 B1 * | 10/2003 | Weng | 714/707 |
| 6,725,321 B1 | 4/2004 | Sinclair et al. | |
| 6,788,612 B2 | 9/2004 | Hsu et al. | |
| 6,794,997 B2 | 9/2004 | Sprouse | |
| 6,903,981 B2 | 6/2005 | Futatsuyama et al. | |
| 6,961,890 B2 | 11/2005 | Smith | |
| 6,978,342 B1 | 12/2005 | Estakhri et al. | |
| 7,039,788 B1 | 5/2006 | Chang et al. | |
| 7,080,192 B1 | 7/2006 | Wong | |
| 7,245,556 B1 | 7/2007 | Pinto et al. | |
| 7,315,870 B2 | 1/2008 | Mukaida | |
| 7,340,581 B2 | 3/2008 | Gorobets et al. | |
| 7,382,660 B2 | 6/2008 | Bovino et al. | |
| 7,409,489 B2 | 8/2008 | Sinclair | |
| 7,409,524 B2 | 8/2008 | Safford et al. | |
| 7,441,090 B2 | 10/2008 | Estakhri et al. | |
| 7,450,420 B2 | 11/2008 | Sinclair et al. | |

(Continued)

OTHER PUBLICATIONS

Ashish Jagmohan et al.; "Write Amplification Reduction in NAND Flash through Multi-Write Coding"; storageconference.org/2010/Presentations/Research/S10.Jagmohan.pdf; Jun. 2010, pp. 1-6.

(Continued)

*Primary Examiner* — Stephen Elmore  
(74) *Attorney, Agent, or Firm* — Cantor Colburn LLP; Daniel Morris

(57) ABSTRACT

Multi-write coding of non-volatile memories including a method that receives write data, and a write address of a memory page. The memory page is in either an erased state or a previously written state. If the memory page is in the erased state: selecting a first codeword from a code such that the first codeword encodes the write data and is consistent with a target set of distributions of electrical charge levels in the memory page; and writing the first codeword to the memory page. If the memory page is in the previously written state: selecting a coset from a linear code such that the coset encodes the write data and includes one or more words that are consistent with previously written content of the memory page; selecting a subsequent codeword from the one or more words in the coset; and writing the subsequent codeword to the memory page.

25 Claims, 10 Drawing Sheets

U.S. PATENT DOCUMENTS

| | | | |
|---|---|---|---|
| 7,457,909 | B2 | 11/2008 | Di Sena et al. |
| 7,493,442 | B2 | 2/2009 | Wong et al. |
| 7,511,646 | B2 | 3/2009 | Cornwell |
| 7,516,371 | B2 | 4/2009 | Sakaue et al. |
| 7,529,881 | B2 | 5/2009 | Pascucci et al. |
| 7,539,077 | B2 | 5/2009 | Yoon et al. |
| 7,697,325 | B2 | 4/2010 | Sprouse et al. |
| 7,877,564 | B2 * | 1/2011 | Eldredge et al. .............. 711/163 |
| 8,050,086 | B2 * | 11/2011 | Shalvi et al. ............. 365/185.02 |
| 2003/0037215 | A1 | 2/2003 | Chen |
| 2004/0160343 | A1 | 8/2004 | Sprouse |
| 2006/0282610 | A1 | 12/2006 | Dariel et al. |
| 2007/0033375 | A1 | 2/2007 | Sinclair et al. |
| 2007/0147168 | A1 | 6/2007 | Pinto et al. |
| 2007/0150644 | A1 | 6/2007 | Pinto et al. |
| 2007/0168632 | A1 | 7/2007 | Zeevi et al. |
| 2007/0171714 | A1 | 7/2007 | Wu et al. |
| 2007/0233941 | A1 | 10/2007 | Lee et al. |
| 2007/0233989 | A1 | 10/2007 | Garcia-Arellano et al. |
| 2008/0256352 | A1 | 10/2008 | Chow et al. |
| 2009/0027652 | A1 | 1/2009 | Chang et al. |
| 2009/0055605 | A1 | 2/2009 | Wu et al. |
| 2009/0080249 | A1 | 3/2009 | Sprouse et al. |
| 2009/0125671 | A1 | 5/2009 | Flynn et al. |
| 2009/0150595 | A1 | 6/2009 | Lavan |
| 2009/0150600 | A1 | 6/2009 | Suda |
| 2010/0281340 | A1 | 11/2010 | Franceschini et al. |
| 2011/0138105 | A1 | 6/2011 | Franceschini et al. |

OTHER PUBLICATIONS

"Improving the endurance characteristics through boron implant at active edge in 1 G NAND Flash"; IEEE, Apr. 15-19, 2007; pp. 652-653.

"Design of on-chip error correction systems for multilevel NOR and NAND flash memories"; F. Sun et al.; IET Circuit Devices Syst., 2007, 1, (3); pp. 241-249.

A. Ben-Aroya; "Competitive Analysis of Flash-Memory Algorithms"; Lecture Notes in Computer Science 4168 (2006) pp. 1-59.

A. Ben-Aroya et al.; "Competitive Analysis of Flash-Memory Algorithms"; ESA 2006; LNCS4168; pp. 100-111.

A. Fiat et al; Generalized "Write-Once" Memories; IEEE Transactions on Information Theory; vol. IT-30, No. 3, May 1984; pp. 470-480.

A. Jiang; On the Generalization of Error-Correcting WOM Codes; in IEEE International Symposium on Information Theory; ISIT 2007, pp. 1391-1395.

A. Jiang et al.; "Floating Codes for Joint Information Storage in Write Asymmetric Memories"; in IEEE International Symposium on Information Theory, ISIT 2007; pp. 1166-1170.

A. Kawaguchi et al.; "A Flash memory Based File System"; pp. 1-10, 1995.

C. Heegard; "On the Capacity of Permanent Memory"; IEEE Transactions on Information Theory; vol. IT-31; No. 1; Jan. 1985; pp. 34-42.

C. Heegard; Partitioned Linear Block Codes for Computer Memory with "Stuck-at" Defects; IEEE Transactions on Information Theory; vol. IT-29; No. 6; Nov. 1983; pp. 831-842.

C. Heegard et al.; "On the Capacity of Computer Memory with Defects"; IEEE Transactions on Informaiton Theory, vol. IT-29, No. 5, Sep. 1983; pp. 731-739.

D. Dolev et al. "Correcting Faults in Write Once Memory"; 1984 ACM 0-89791-133-4/84/004/0225; pp. 225-229.

D. Woodhouse; "JFFS: The Journaling Flash File System"; in Ottawa Linux Symposium; pp. 1-12, 2001.

E. Yaakobi et al.; "Error Correction Coding for Flash Memories"; Flash Memory Summit, Aug. 2009; pp. 1-17.

E. Yaakobi et al.; "Multidimensional Flash Codes"; arXiv.0901.0702v3 [cs.IT]; Apr. 3, 2009; pp. 1-8.

Eran Gal et al.; "Algorithms and Data Structures for Flash Memories"; ACM Computing Surveys 37, No. 2, (2005); pp. 138-163.

F. Merkx; 09-Womcodes Constructed With Projective Geometries; Traitement du Signal; vol. 1, No. 2-2 (1984); pp. 227-231.

Fang-Wei Fu et al.; "On the Capacity and Error-Correcting Codes of Write-Efficient Memories"; IEEE Transactions on Information Theory; vol. 46; No. 7; Nov. 2000; pp. 2299-2314.

Fang-Wei Fu et al.; "On the Capacity of Generalized Write-Once Memory with State Transitions Described by an Arbitrary Directed Acyclic Graph"; IEEE Transactions of Information Theory; vol. 45; No. 1; Jan. 1999; 308-313.

G. Cohen et al.; "Linear Binary Code for Write Once Memories"; IEEE Transactions on Information Theory; vol. IT-32; No. 5; Sep. 1986; pp. 697-700.

Godard et al.; "Evaluation of Design for Reliability Techniques in Embedded Flash Memories"; 2007; IEEE Xplore (978-3-9810801-2-4/DateJul. 2007 EDAA); pp. 1-6.

H. Finucane et al.; "Designing Floating Codes for Expected Performance"; in Communication, Control and Computing; 2008, 46th Annual Allerton Conference on 2008; pp. 1389-1396.

H. Finucane et al.; "Worst-Case and Average-Case Floating Codes for Flash Memory"; Computer Science Group, Harvard University; TR-04-09; pp. 1-43, Apr. 21, 2009.

Hu et al.; "Write Amplification Analysis in Flash-Based Solid State Drives"; SYSTOR 2009; pp. 1-13.

IBM; Adding and Wear-Leveling (and Potentially Atomic Journaling) Support for Metadata on FAT12/FAT16/FAT32 File System; IP.com No. IPCOM000175280D; Publication Date: Oct. 7, 2008; pp. 1-3.

Ivaniuk et al.; Detecting Multiple Errors in RAM by Self-Adjusting Output Data Compression, ISSN 1063-7397, Russian Microelectronics 2007; vol. 36, No. 4, pp. 271-277.

J. Fridich et al.; "Steganography via Codes for Memory with Defective Cells"; in 43rd Conference on Coding; Communication and Control 2005; pp. 1-17.

J. Martin Borden et al.; On-Coding for "Stuck-At" Defects; IEEE Transactions on Information Theory; vol. IT-33; No. 5; Sep. 1987; pp. 729-735.

Jai Menon et al.; "An Age Threshold Algorithm for Garbage Collection in Log-Structured Arrays and File Systems"; (Citeseer, 1998); pp. 1-15.

Li-Pin Chang et al.; Real-Time Garbage Collection for Flash-Memory Storage Systems of Real-Time Embedded Systems; ACM Transactions on Embedded Computing Systems; vol. 3, No. 4, Nov. 2004; pp. 837-863.

M. Mitzenmacher et al.; "The Power of Two Random Choices: A Survey of Techniques and Results"; pp. 1-60, (2000).

Mahdavifar et al; "A Nearly Optimal Construction of Flash Codes"; arXiv:0905.1512v1 [cs.IT]; May 10, 2009; pp. 1-5.

R. Krishnamoorthy et al.; "Error Control to Increase the Yield of Semiconductor RAM's"; in Information Theory Workshop at Cornell; the 1989 IEEE/CAM, 1989, 7-3; 1 page.

R. Rivest et al.; How to Reuse a "Write-Once" Memory; Reprinted from Information; vol. 55, Nos. 1-3, Oct./ Nov./Dec. 1982 Printed in Belgium; 1-19.

Michele M. Franceschini et al.; U.S. Appl. No. 12/903,695, filed: Oct. 13, 2010; "Multi-Write Endurance and Error Control Coding of Non-Volatile Memories".

* cited by examiner

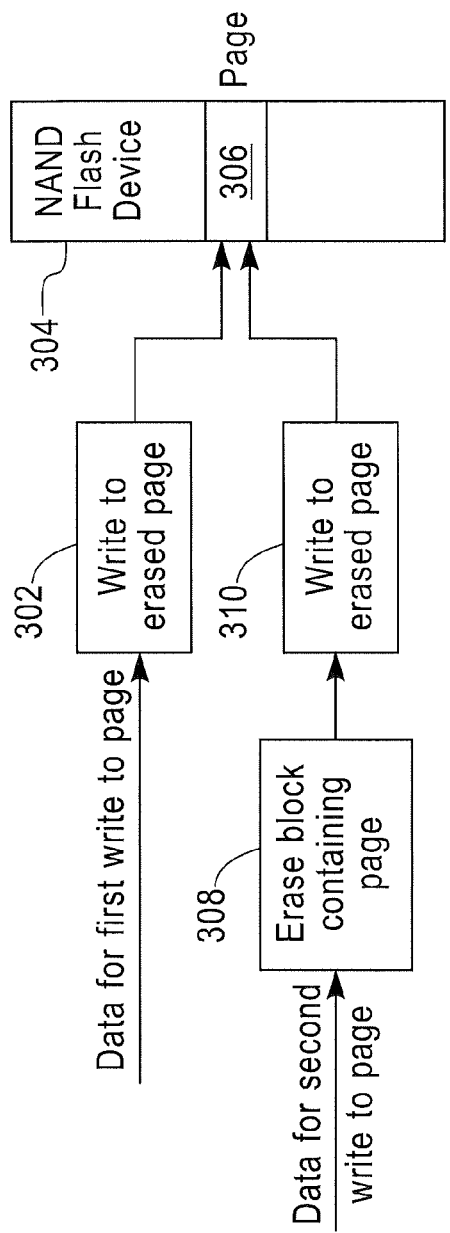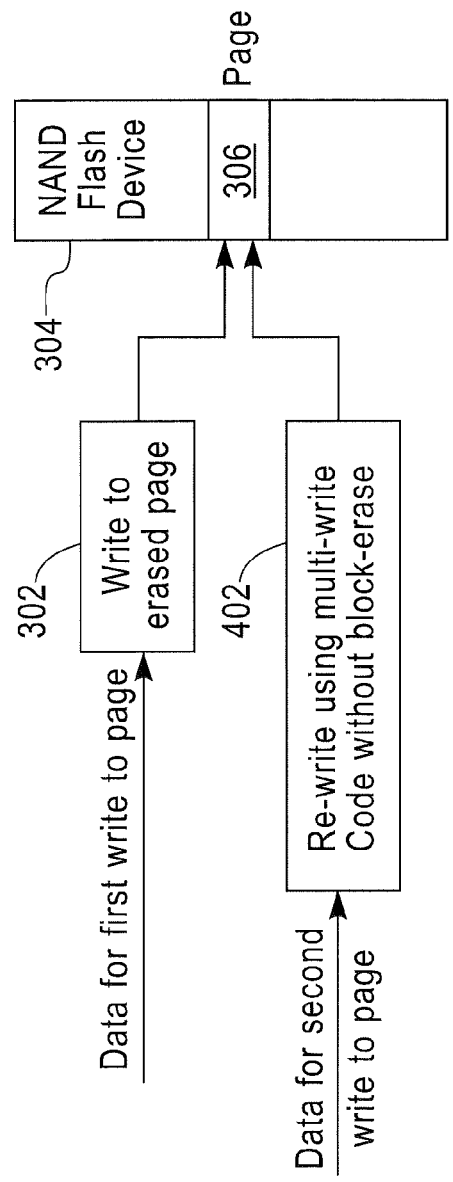

MULTI-WRITE CODING OF NON-VOLATILE MEMORIES

BACKGROUND

This present invention relates generally to computer memory, and more specifically to multi-write coding of non-volatile memories.

Phase-change memories (PCMs) and flash memories are examples of non-volatile memories with limited endurance (also referred to as a "limited life"). Such memories have limited endurance in the sense that after undergoing a number of writing cycles (RESET cycles for PCM, program/erase cycles for flash memory), the memory cells wear out and can no longer reliably store information One characteristic of contemporary NAND flash memory devices is that they do not support page erase. The absence of page erases, implies that once a page is written, it cannot be rewritten until the entire block (e.g., made up of sixty-four pages) is erased. If a logical address corresponding to a page needs to be refreshed, this is accomplished by marking the page as invalid and mapping the logical block address to a different physical page. Periodic garbage collection is required to be performed, where blocks with only a few valid pages are freed up by copying their valid pages to other physical pages, after which the block can be erased. This increases the number of writes required in a flash memory device, an effect that is often referred to as "write amplification". Write amplification adversely affects the lifetime of the flash device due to the wear caused by the additional program/erase cycles.

SUMMARY

An exemplary embodiment is a computer implemented method for storing data. The method includes receiving write data, and a write address of a memory page. The memory page is in either an erased state or a previously written state, and is associated with a plurality of memory cells having electrical charge levels. In response to the memory page being in the erased state: selecting a first codeword from a code such that the first codeword encodes the write data and is consistent with a target set of distributions of electrical charge levels in the memory page; and writing the first codeword to the memory page. In response to the memory page being in the previously written state: selecting a coset from a linear code such that the coset encodes the write data and includes one or more words that are consistent with previously written content of the memory page; selecting a subsequent codeword from the one or more words in the coset; and writing the subsequent codeword to the memory page.

Another exemplary embodiment is a computer implemented method for storing data. The method includes receiving write data, and a write address of a memory page. The memory page is in either an erased state or a previously written state, and is associated with a plurality of memory cells having electrical charge levels. The memory page is separated into a plurality of sub-pages. In response to the memory page being in the erased state: selecting a sequence of first sub-page symbols, the selecting including selecting a first sub-page symbol from a set of first sub-page symbols for each of the sub-pages such that the sequence of first sub-page symbols encodes the write data and is consistent with a target set of distributions of the first sub-page symbols over the memory page; and writing the sequence of first sub-page symbols to the memory page. In response to the memory page being in the previously written state: selecting a sequence of subsequent partition indices, the selecting including selecting a subsequent partition index from a set of subsequent partition indices for each of the sub-pages in the memory page such that the sequence of partition indices encodes the write data and is consistent with a target set of distributions of subsequent partition indices; selecting, for each of the sub-pages in the memory page, a subsequent sub-page symbol which is consistent with previous content of the sub-page, the subsequent sub-page symbol selected from a partition corresponding to the subsequent partition index selected for the sub-page; and writing the subsequent sub-page symbols to the memory page.

A further exemplary embodiment is a computer implemented method for storing data. The method includes receiving write data, the write data having a data rate; and receiving a write address of a memory page. The memory page is associated with a plurality of memory cells, and is in either an erased state or a previously written state. In response to the memory page being in the erased state: selecting a first code in response to the data rate and to a target number of memory cells to be programmed in a first write; applying the first code to the write data to generate a first codeword; and writing the first codeword to the memory page. In response to the memory page being in the previously written state: selecting, at the computer, a subsequent code in response to the data rate, to a target number of memory cells to be programmed in a subsequent write, to current contents of the memory cells in the memory location, and to a constraint that any of the memory cells that are currently programmed in the memory page remain programmed when the subsequent code is applied to the compressed data; applying, at the computer, the subsequent code to the write data to generate a subsequent codeword; and writing the subsequent codeword to the memory location, thereby allowing the memory location to be written multiple times between erasures.

A still further exemplary embodiment is a system including a receiver, a first codeword generator, and a subsequent codeword generator. The receiver is for receiving write data and a write address of a memory page in a memory device. The memory page is associated with a plurality of memory cells, and is in one of an erased state and a previously written state. The write data is characterized by a data rate. The first codeword generator is for generating a first codeword in response to the memory page being in the erased state. The generating a first codeword includes: selecting a first code in response to the data rate and to a target number of memory cells to be programmed in a first write, and applying the first code to the write data to generate the first codeword. The subsequent codeword generator is for generating a subsequent codeword in response to the memory page being in the previously written state. The generating a subsequent codeword includes: selecting a subsequent code in response to the data rate, to a target number of memory cells to be programmed in a subsequent write, to current contents of the memory cells, and to a constraint that any of the memory cells that are currently programmed in the memory page remain programmed when the subsequent code is applied to the write data; and applying the subsequent code to the write data to generate the subsequent codeword, thereby allowing the memory location to be written multiple times between erasures.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 3 illustrates a block diagram of a write process to a NAND flash memory device that requires a block erase prior to a page rewrite;

FIG. 4 illustrates a block diagram of a write process to a NAND flash memory that may be implemented by an exemplary embodiment where a page rewrite may be performed without first performing a block erase;

DETAILED DESCRIPTION

Figure 1:
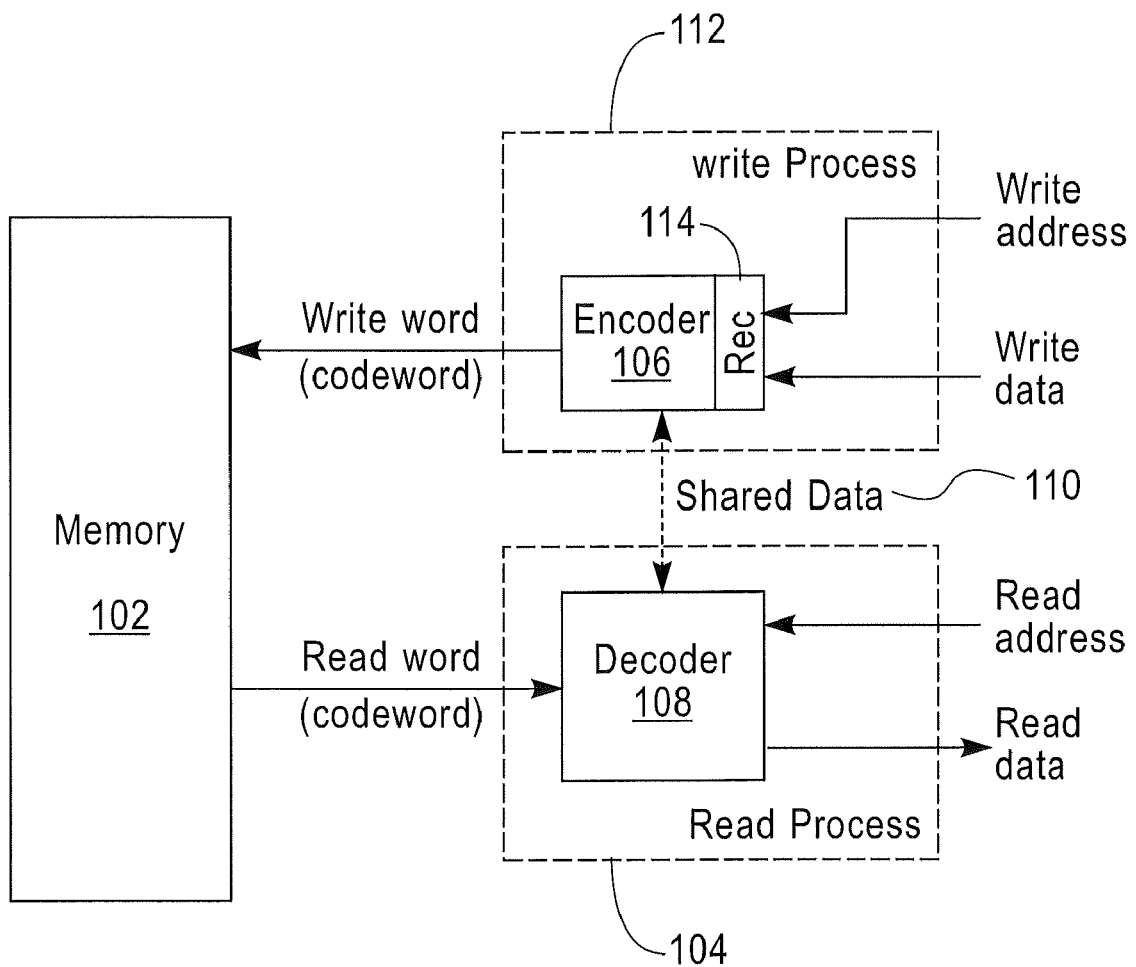
FIG. 1 illustrates a block diagram of a system for storing and retrieving data in a memory system that may be implemented by an exemplary embodiment.

Exemplary embodiments of the present invention provide multiple write codes that are used to allow a page in a non-volatile memory, such as a not-and (NAND) flash memory device, to be written multiple times before it needs to be erased. In exemplary embodiments, the multiple write codes are designed to maximize the endurance of NAND flash memory devices by minimizing the number of cells required to be programmed in each write. This significantly reduces write amplification (and the associated loss of endurance and write latency) and increases the lifetime of the cells in each page. Further, exemplary embodiments allow flexibility in coding in that a wide range of allowable data rates can be encoded. Exemplary embodiments enable the important case where large data rates are encoded, and the rewriting is performed a small number of times (including just twice).

In an exemplary embodiment, a first write uses a constrained code that seeks to minimize the number of programmed cells while only allowing certain types of programmed cell patterns to be written. In subsequent writes, a sparse partition code is used where each data vector to be encoded can be represented by multiple possible code vector sequences. From these, a code vector is selected so as to be consistent with previously programmed cells, and which minimizes the number of cells which need to be additionally programmed. Consistency implies that the target program level for each cell is attainable, or that at most only a small number of cells cannot attain their respective target programmed levels (the erroneous data in such cells can subsequently be corrected by the use of error-control coding). The selected code vector is written into memory so as to describe the data vector. This code vector may satisfy additional constraints on the patterns of programmed cells in order to allow more subsequent rewrites. In an exemplary embodiment, this technique is combined with data compression, so as to adapt to the compressed data rate. This can provide substantial benefits in system performance by simplifying bookkeeping.

As used herein, the term "target distribution" refers to a desired distribution of the frequency of discrete items. For example, a memory cell may be capable of storing two values, "1" and "0", each value represented by a discrete electrical charge level range. A first range of electrical charge levels may be associated with the value "1" and a second range of electrical charge levels may be associated with the value "0". If there are four memory cells, a target distribution may be to have one memory cell in the first range and three memory cells at the second range. Another target distribution would be to have two memory cells at the first range and two memory cells at the second range. In another example, a target distribution of sub-page symbols on a memory page refers to a number of times that each type of sub-page symbol should occur on the memory page. The target distribution can also be expressed in normalized terms; thus, in the first example, a target distribution may be to have 25% of the memory cells in the first range and 75% of the memory cells at the second range. Another target distribution would be to have 50% of the memory cells at the first range and 50% of the memory cells at the second range. As used herein, the term "target set of distributions" refers to a distribution (normalized or otherwise) from a set of desired or acceptable distributions of the frequency of discrete items. As an example, a target set of distributions might include all distributions where less than 25% of the memory cells are at the first range. In this case, both the distribution wherein 20% of memory cells are at the first range (and the remaining 80% are at the second range) and the distribution wherein 10% of the cells are at the first range (and 90% are at the second range) belong to the target set of distributions.

FIG. 1 illustrates a block diagram of a system for storing and retrieving data in a memory that may be implemented by exemplary embodiments. The system depicted in FIG. 1 includes a memory 102 having blocks of memory cells (each block made up of pages), an encoder for receiving write data and generating a write word for storage in the memory cells, a decoder 108 for receiving a read word from the memory and generating read data, and shared data 110 storing characteristics of the stored data for use by both the encoder 106 and the decoder 108. In an exemplary embodiment, the encoder 112 and shared data 110 are utilized by a write process 112, and the decoder 108 and shared data 110 are utilized by a read process 104.

In an exemplary embodiment the encoder 106, decoder 104, and shared data 110 are located on a memory controller or memory module. In an alternate exemplary embodiment, the encoder 106, decoder 104, and shared data 110 are located on a memory device. The shared data 110 may be stored in a register or any other storage location that is accessible by both the encoder 106 and the decoder 104.

In an exemplary embodiment, the memory 102 is implemented by NAND flash memory devices or other non-volatile memory devices.

Inputs to the encoder 106 depicted in FIG. 1 include the address of the page to be written (also referred to herein as a "write address"), and the data to be written to the page. As shown in FIG. 1, the inputs are received via a receiver 114 located on the encoder 106. In an exemplary embodiment, the inputs are received via a receiver (e.g., located on a memory device, memory module, memory controller, or other location). The receiver may be implemented in a variety of manners including hardware for receiving the inputs and/or a storage location (e.g., a register) where the inputs are located.

An input to the decoder 108 depicted in FIG. 1 includes the address of the memory location (e.g., a page) to be read. In an exemplary embodiment, the input is received via a receiver (e.g., located on a memory device, memory module, memory controller, or other location). The receiver may be implemented in a variety of manners including hardware for receiving the inputs and/or a storage location (e.g., a register) where the inputs are located.

An output from the decoder 108 depicted in FIG. 1 includes the read data. In an exemplary embodiment, the outputting is by a transmitter (e.g., located on a memory device, memory module, memory controller, or other location). The transmitter may be implemented in a variety of manners including hardware for transmitting the output and a storage location or register where the outputs are stored.

Figure 2:
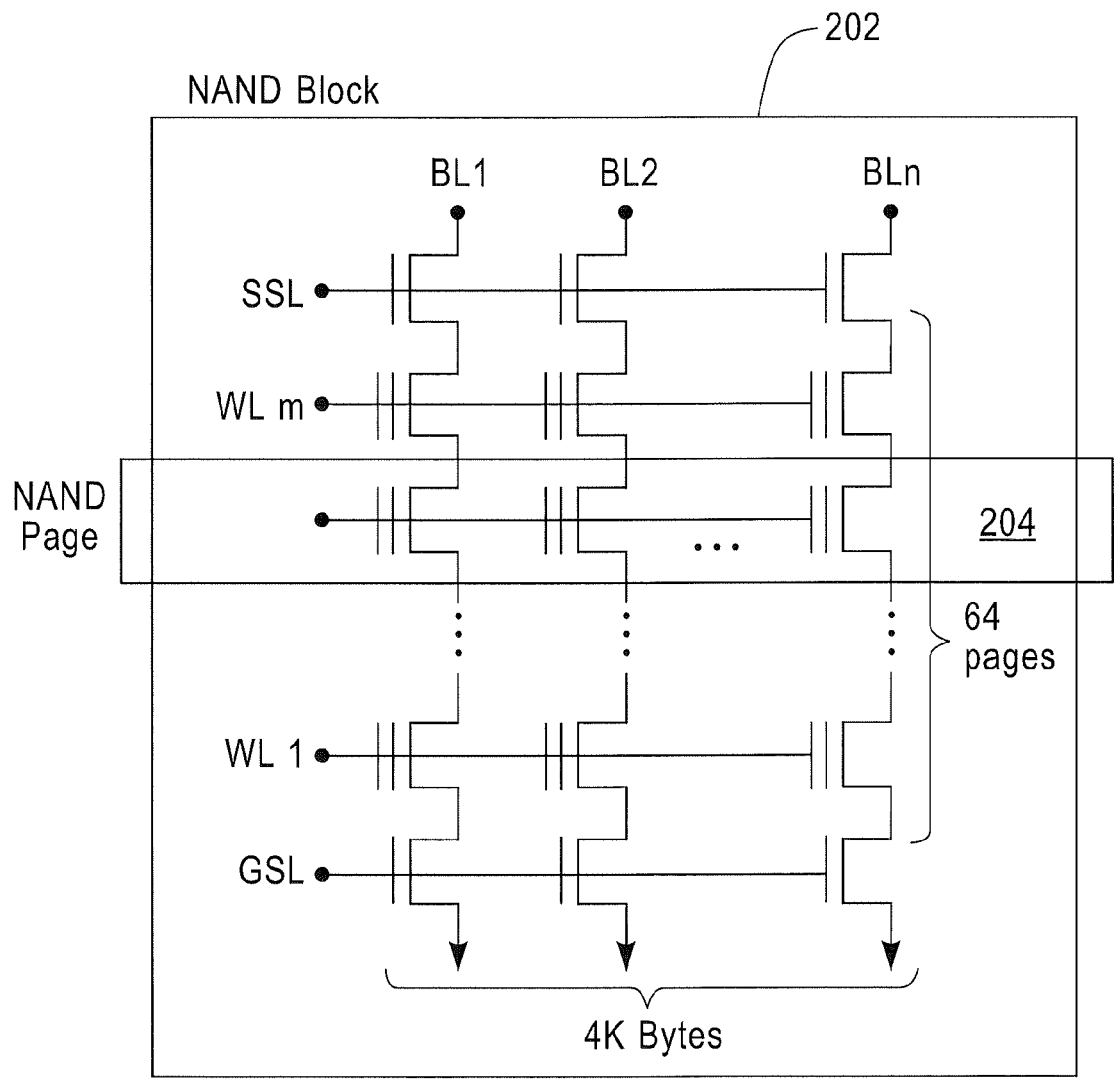
FIG. 2 illustrates a block diagram of a not-and (NAND) flash memory that may be implemented by an exemplary embodiment.

FIG. 2 illustrates a block diagram of a NAND flash memory that may be implemented by an exemplary embodiment. The NAND block 202 depicted in FIG. 2 includes a plurality of pages 204, with each page made up of a plurality of memory cells. In the example depicted in FIG. 2, sixty-four pages make up the block 202, however other numbers of pages may also make up one block of NAND memory (e.g., one hundred and twenty eight, and thirty two). In the example depicted in FIG. 2, each page is made up of thirty four thousand five hundred and twelve memory cells (of which 4096*8 cells are designated as a 4 Kilobyte (KB) data storage area, and the rest constitute a spare area), however other numbers of memory cells may make up one page of NAND memory (e.g., the data storage area may be 2 KB or 8 KB). FIG. 2 includes a plurality of bit lines (denoted "BL1", "BL2", "BLn"), a plurality of word lines (denoted "WL1" and "WLm"), a ground selection line (GSL), and a source selection line (SSL). Additionally, for an MLC device, each page may consist of a given bitplane from a row of cells. For example, one page may consist of the least significant bits of a row of cells, while another may consist of the most significant bits of a row of cells.

In a typical flash device, a mapping between physical and logical block addresses is maintained in the controller. Given a logical address and data for a write, the controller selects an erased physical page to write the data onto and records the logical-to-physical mapping. A typical example is the use of a log-based file system where the physical page is the next erased page in the block to which the last logical page was written to, wherein the pages are sequenced, for example on the basis of proximity to the GSL.

In NAND flash memory, pages are the smallest write units and blocks are the smallest erase units. In an exemplary embodiment, the NAND flash memory has two-level cells (called single-level cell or "SLC" NAND flash, since there is only a single programmed level), and once a memory cell is programmed (e.g., changed from a "1" to a "0"), it cannot be changed until the entire block is erased. In this exemplary embodiment, erasing results in all memory cells in the block having a value of "1".

In another exemplary embodiment the NAND flash memory has multi-level cells supporting more than two-levels (called multi-level cell or "MLC" NAND flash). Once a cell is programmed to a non-erased level, it can only be reprogrammed to a strict subset of possible levels without erasure. For example, an MLC memory may consist of cells capable of storing four levels. Each of the four levels may be denoted by a two-bit string, say, levels {11, 10, 01, 00} in order of increasing floating-gate charge, where the level "11" represents the erased state. A cell programmed with level "01" may be reprogrammed to levels "01" or "00" without requiring erasure; however, if it needs to be reprogrammed to level "11" or level "10" a block erase is required. Because it is a relatively costly operation (e.g., taking about two milliseconds of time in some implementations and reducing the remaining useful life of programmed memory cells by at least one write), block erasing is generally performed as infrequently as possible. Thus, in practice, when a logical address has to be rewritten, it is mapped to a different physical page and the old page is invalidated. A process referred to as "garbage collection" is performed periodically to free up the invalid pages. Garbage collection involves moving valid pages to other blocks and thus, leads to write amplification (or an increase in the number of writes). Write amplification is a fundamental problem of significance in NAND flash memory devices because it further reduces the already limited device life of flash memory and it reduces performance because page programming and block erase are relatively costly in terms of time.

Exemplary embodiments allow for multiple-write codes for NAND flash memory. By writing to each page multiple times without erasing, write amplification can be significantly reduced. Even two writes per page significantly improves endurance and write performance. In exemplary embodiments for SLC NAND Flash, multiple writes are performed by ensuring that in each write, only erased cells need to be programmed and that programmed cells never need to be erased. In an exemplary embodiment, this is accomplished by employing a partition-based code where the partition index is selected based on the data vector and a word is selected from the partition which is consistent with the previous page content (i.e., the selected word does not have an erased cell-level in a position with a previously programmed cell exists, or at most a small number of such cell positions exist which can be taken care of by the error-control code conventionally used on the flash page). Further, in exemplary embodiments, the multiple write codes are selected to minimize the number of programmed cells in each write. In still further exemplary embodiments, a generated codeword may additionally satisfy other constraints to allow future writes on the page before the next erasure.

In another exemplary embodiment that uses MLC NAND flash, multiple writes are performed by ensuring that in each write, cells need to be programmed only to levels which they can attain via reprogramming without block erasure. In an exemplary embodiment, this is accomplished by employing a partition-based code wherein the partition index is selected based on the data vector, and a word is selected from the partition which is consistent with the previous page content i.e. the selected word does not have a cell-level in a position which cannot be reached without erasure from the previously programmed cell-level, or at most a small number of such cell positions exist which can be taken care of by the error-control code conventionally used on the flash page. In an exemplary embodiment, the multi-level partition consists of multiple binary partition codes. Further, in exemplary embodiments, the multiple write codes are selected to attain a desired set of frequencies for the levels, so as to ensure minimal wear to the memory. In still further exemplary embodiments, a generated codeword may additionally satisfy other constraints to allow future writes on the page before the next erasure.

FIG. 3 illustrates a block diagram of a write process to a NAND flash memory device that requires a block erase prior to a page rewrite. At block 302 in FIG. 3, data for a first write is written to a page 306 in a NAND flash device. As shown in FIG. 3, the page 306 is erased prior to the writing of the data. At block 308 in FIG. 3, when data for a second write to the page 306 is received, the block containing the page 306 is erased. Block 308 can be performed prior to or subsequent to receiving the data for the second write to the page, and may require garbage collection to be performed such that the valid block pages are rewritten to other memory pages. At block 310, the data for the second write is then written to the page 306.

FIG. 4 illustrates a block diagram of a write process to a NAND flash memory that may be implemented by an exemplary embodiment where a page rewrite may be performed without first performing a block erase. The processing of the first write to the page 306 is the same as the process described in FIG. 3. At block 302 in FIG. 4, data for a first write is written to a page 306 in a NAND flash device. As shown in FIG. 4, the page 306 is erased prior to the writing of the data. At block 402 in FIG. 4, when data for a second (or other subsequent) write to the page 306 is received, the page 306 is first read and then rewritten in a manner that is consistent with what was read using a multiple write code that does not require the block containing the page 306 to be erased. As used herein, the term "first codeword generator" refers to the portion of the encoder 106 that generates the codeword for the first write (i.e., when the page 306 is in an erased state), referred to therein as the "first codeword." As used herein, the term "subsequent codeword generator" refers to the portion of the encoder 106 that generates the codeword for the second write (i.e, when the page 306 is in a previously written state), referred to herein as the "subsequent codeword."

Figure 5:
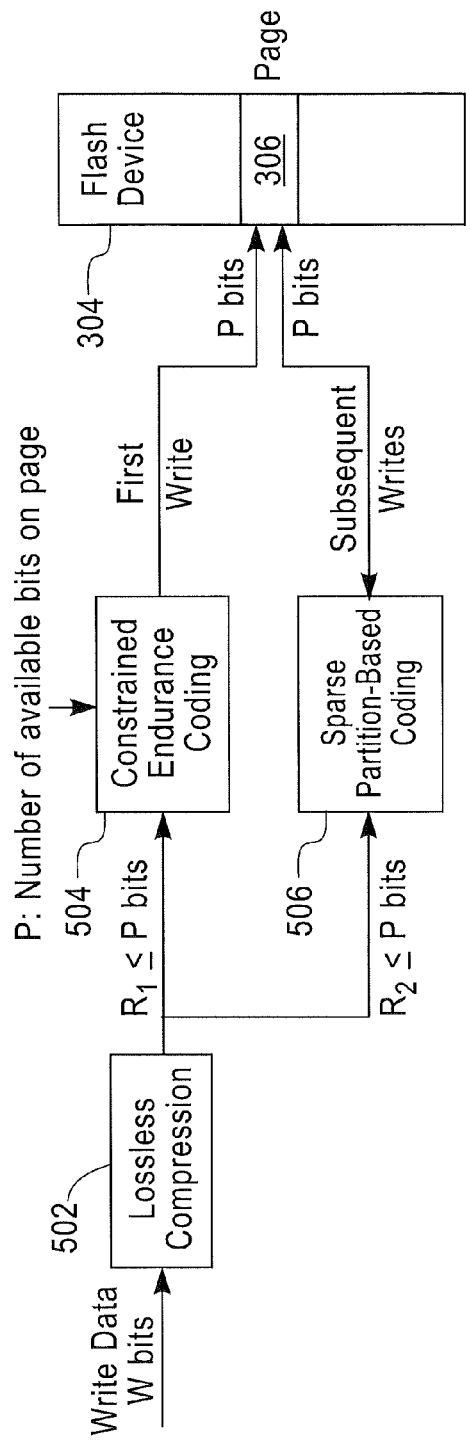
FIG. 5 illustrates a block diagram of a multiple-write process that may be implemented by an exemplary embodiment.

FIG. 5 illustrates a block diagram of a multiple-write process that may be implemented by an encoder, such as encoder 106 in an exemplary embodiment. As depicted in FIG. 5, a constrained endurance code is used to create a first codeword to be written by the first write, and a sparse partition-based code is used to generate subsequent codewords written by subsequent writes. In a first write to the erased physical page 306 in the flash device 304, the data to be written ("W" bits of write data) is losslessly compressed by a data compressor, and then re-expanded by a first codeword generator 504 using constrained endurance coding which seeks to minimize the number of cells programmed on the flash device 304. The minimizing may be performed by selecting a first codeword such that less than a threshold number of bits are programmed when the first codeword is written to the page. The threshold may be programmable and/or it may be set/adjusted automatically in response to the number of bits in the data being written (e.g., the data rate of the compressed data if compression is used, the data rate of the data to be written if compression is not used) and the number of bits (or size) of the memory page. In an alternate exemplary embodiment, the compression is not performed. In an alternate exemplary embodiment, when the initial data size is less than P, the compression is not performed.

In an exemplary embodiment, the lossless compression 502 is performed by a data compressor, which applies a lossless data compression algorithm to compress the write data. Examples of lossless data compression algorithms that may be implemented include, but are not limited to: arithmetic coding, Huffman coding, Lempel-Ziv coding, and Burrows-Wheeler transform (BWT) coding. In addition, if characteristics (such as statistics) of the write data are known a-priori or are predictable, any specialized lossless coding algorithm may be applied which exploits this knowledge in order to compress the data more effectively. The output from the lossless compression 502 contains "$R_1$" bits, where "$R_1$" is less than the number of bits, "W", in the write data that was input to the lossless compressor 502.

In the first write, the output of the lossless compression 502 is input to the constrained endurance code 504, along with the number of available cells on the page 306 (denoted "P"), to generate a codeword to be written to the page 306 in the flash device 304. The codeword is made up of "P" bits and in an exemplary embodiment "P" is equal to "W". An example of a constraint enforced by the constrained code includes minimizing the number of programmed cells to be written to the page, while only allowing certain bit-patterns to be written. The number of cells programmed can be minimized by an appropriate selection of the number of programmed cells (also referred to herein as a "threshold" number of bits to be programmed) for SLC NAND flash. An alternative constraint is to only write symbol-patterns that have a target set of frequency distributions (also referred to herein as a "target set of distributions") of symbol-levels for MLC flash. For example, for 4-level MLC flash, only P/2-length patterns that have at least 50% erased levels may be allowed. As another example for 4-level MLC flash, only P/2-length patterns which have a frequency distribution of {0.4, 0.3, 0.2, 0.1} over the four levels may be allowed. In an exemplary embodiment, the constrained endurance coding 504 is a function of the compression rate of the code. The codeword produced by the constrained endurance coding 504 is written to the page 306. The lossless compression is optional. In an exemplary embodiment, there is no lossless compression step, $R_1$ is equal to W, and P is greater than W.

In an exemplary embodiment, a subsequent rewrite to the same page 306 (without an intervening erase) is performed as follows. The data to be written (i.e., the W bits of write data) is compressed using the lossless compression 502 described previously. In an exemplary embodiment, depending on the compression rate $R_2$, a sparse partition-based code is used, where each data sequence is mapped to a plurality of representative code sequences. Of these, a code sequence (i.e., a codeword) is selected which is consistent with previously programmed cells (whose values cannot be changed for SLC or can only be reprogrammed in a restricted manner for MLC). The selected code sequence is also selected to minimize the additional wear to the memory (by minimizing the number of cells which would additionally need to be programmed, or by utilizing a distribution of reprogrammed levels which minimize the additional wear associated with reprogramming). The minimizing may be performed by selecting a code sequence that results in less than a threshold wear cost being incurred when the writing to the memory page. The threshold may be programmable and/or it may be set/adjusted automatically in response to the number of bits in the data being written (e.g., the data rate of the compressed data if compression is used, the data rate of the data to be written if compression is not used) and the number of bits (or size) of the memory page. The selected code sequence may also be selected to satisfy additional constraints to allow subsequent-rewrites. As depicted in FIG. 5, this process is sparse partition based coding 506. The sparse partition based code is designed to exploit the constraints imposed by previous codes. The codeword produced by the partition-based coding 506 is then written to the page 306. In an exemplary embodiment, there is no lossless compression step, $R_2$ is equal to W, and P is greater than W.

Advantages of the approach depicted in FIG. 5 include a reduction in the number of cells written, or programmed, per write, thereby increasing the lifetime of the memory device. In addition, the process depicted in FIG. 5 is rate-flexible and may be used for a range of write rates, or data rates. In addition, the process depicted in FIG. 5 allows the practically important scenario of rewriting a large amount of data a small number of times.

Figure 6:
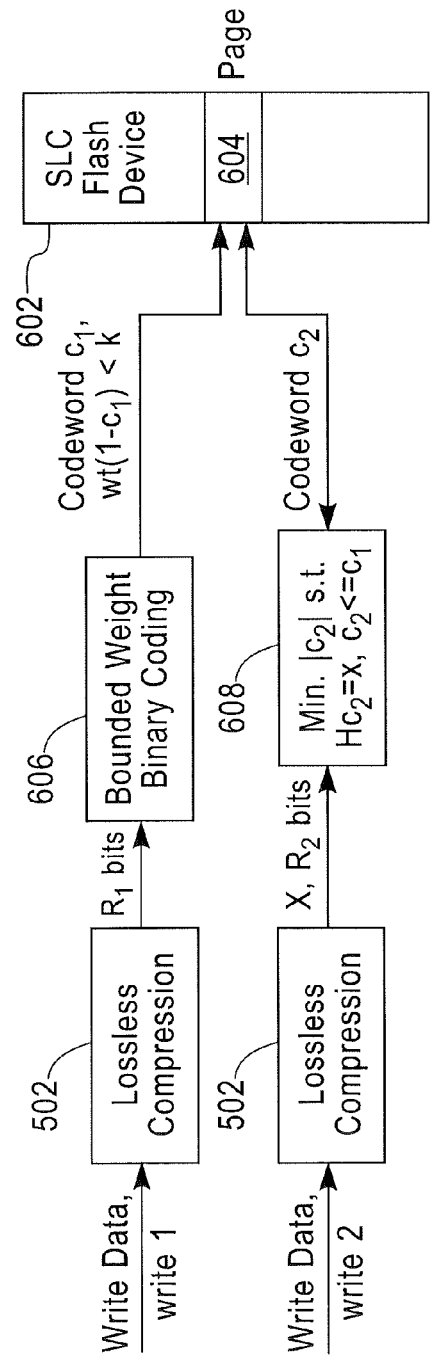
FIG. 6 illustrates process flow of a multiple-write process minimizing the number of cells programmed that may be implemented by an exemplary embodiment.

FIG. 6 illustrates a multiple-write process that minimizes the number of programmed memory cells that may be implemented by an exemplary embodiment. In this exemplary embodiment, the memory is a SLC NAND flash device 602, where each cell can be in one of two levels (erased and programmed) and changing from a programmed to an erased level requires a block-erase. The first write to a page 604 uses lossless compression 502 followed by bounded weight binary coding 606 to generate codeword "$c_1$". The constraint satisfied by the codeword, "$c_1$", is that the number of programmed cells is bounded by a pre-specified constant, "k".

Figure 7:
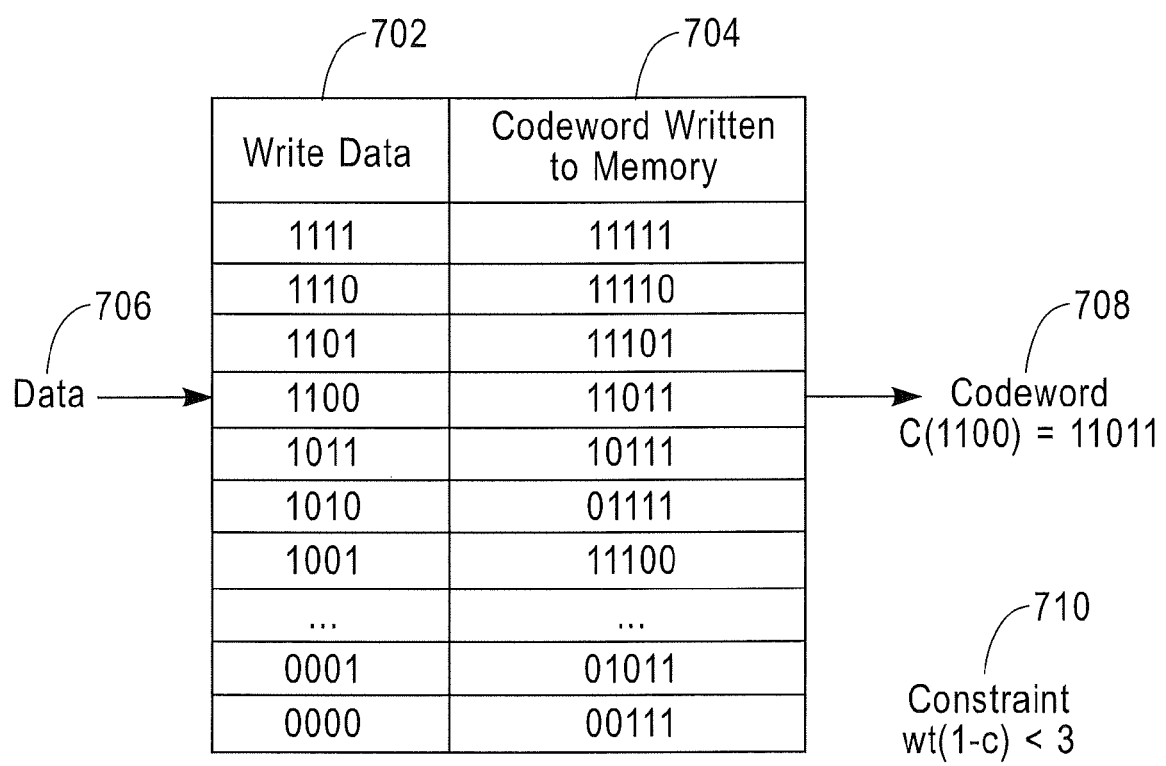
FIG. 7 depicts a bounded weight binary code that may be implemented by an exemplary embodiment.

FIG. 7 depicts a bounded weight binary code that may be implemented by an exemplary embodiment. As shown in FIG. 7, the code is represented by a table indexed by the write data 702. The column corresponding to write data indices does not need to be stored in memory since it can be easily computed from the binary data sequence. The contents of the table stored in memory are the column of codewords 704, made up of mutually distinct binary sequences of length P (in this example P is equal to five), with each sequence containing at most two zeros. Thus, the constraint 710 satisfied by the code is that the number of programmed cells is less than three. The codeword corresponding to data 706 is found by reading off the corresponding codeword entry in the table. Thus, for example, the codeword corresponding to data "1100" is the sequence "11011". In an alternative embodiment, the constraint satisfied by the code is that of constant weight, i.e. every codeword has a constant number of programmed levels (0s).

Referring back to FIG. 6, in a subsequent re-write to the page 604, the write data is compressed using lossless compression 502, with the resulting compressed data denoted by "X" and made up of "$R_2$" bits. This is followed by computing 608 a codeword "$c_2$" ("$c_2$" is also referred to herein as a "word") such that "$Hc_2=X$", where "H" is one of a plurality of pre-fixed binary matrices known to both the encoder and the decoder such that the codeword is consistent with previously programmed cells (i.e., that it does not seek to erase a previously programmed cell, or only does so a small number of times). The set of codewords {c} for which Hc=X is a partition of the space of all words, and is referred to herein as a coset of the linear code consisting of codewords {C} for which Hc=0. Thus, the data is encoded by the selected coset of a linear code, and a codeword belonging to a coset is selected such that it is consistent with previously programmed cells. The computed codeword is written on the page 604.

In an exemplary embodiment, the codeword further satisfies the constraint that it requires the smallest number of additional programmed bits of all codewords which satisfy the equation $Hc_2=X$. In an exemplary embodiment, H is a random binary linear matrix with a number of rows equal to the rate of the compressed data, and number of columns equal to the length of the codeword $c_2$. In another exemplary embodiment, H is the parity check matrix of a binary linear error-control code. In an exemplary embodiment, the length of the codeword $c_2$ is less than the page size to allow subsequent error-control coding to be done. In another exemplary embodiment, the codeword $c_2$ may span multiple physical pages as such an expansion may allow a smaller number of total cells to be programmed. The codeword $c_2$ can be found by an exhaustive search, or by known techniques such as integer optimization.

During the read process, a decoder, such as decoder 108, recovers the data rewritten onto the page 604 by multiplying the codeword $c_2$ (read from the page 604) by the pre-specified matrix H. The matrix, H, is an example of the shared data 110 that is utilized by both the encoder 106 and the decoder 108 depicted in FIG. 1. In addition, a value tracking whether the write is/was a first write or a subsequent write is another example of shared data 110 that is utilized by both the encoder 106 and the decoder 108 depicted in FIG. 1. The lossless compression 502 is optional, and is removed in an exemplary embodiment.

In an exemplary embodiment, the selection of the codeword has an adaptive element because one of a plurality of code-tables and H matrices may be selected, and these vary (from write to write) based on the compression rate of the write data, and/or the desired size of the codeword. The desired size of the codeword may vary (from write to write) based on wear-based expansion requirements (e.g., based on factors such as age of the memory device or number of previous writes to the memory cells a lower amount of wear be necessary, and so a longer codeword spanning multiple pages pay be required).

An example of the process depicted in FIG. 6 follows. This example is for explanation purposes and uses write data with only four bits (e.g., P is equal to four). In an actual implementation P is much larger than four (e.g., the number of bits in a page or half page). In this example, in the first write, four bits of write data are compressed, using the lossless compression 502, into compressed data, "X", made up of two bits (e.g., R is equal to two). Thus, in an exemplary embodiment, the bounded weight binary coding 606 will use a table made up of four entries (i.e., two raised to the "R" entries). In this example, the mapping from X into $c_1$ includes: "00"→"1111"; "01"→"1110", "10"→"1101", and "11"→"1011". In this example, the codeword was selected to minimize the number of 0s (or programmed cells). Thus, in this example "k" is equal to two, and wt($1-c_1$) is less than two. The mapping is stored as shared data along with an indication that this is a first write for use by a decoder when the data is read.

In the second (or subsequent) write, four bits of write data are compressed, using the lossless compression 502, into compressed data, "X", made up of two bits (e.g., R is equal to two). In this example, it is assumed that the first codeword, $c_1$, written to the page 604 was the codeword "1110". This implies that the codeword of a subsequent write must have a "0" in the last position (i.e., because once a cell is programmed with a "0" value, it must be erased to go back to a value of "1"). It is assumed that the compressed version of the write data for the second write has a value of "01". The value of "01" is input to the computing 608 which finds a second codeword, $c_2$, having a minimum number of "0"s and a "0" in the last position. It is assumed that the shared 2×4 H matrix for $R_2=2$ has a first row equal to [1,1,0,1] and a second row equal to [1,0,1,0]. In this case, codewords c=[0,0,1,0] and c=[1,1,0,0] both satisfy Hc=X and are consistent with the requirement that the last cell-position be a 0. Since c=[1,1,0,0] requires only one additional cell to be programmed, while c=[0,0,1,0] requires two additional cells to be programmed, $c_2$ is set to [1,1,0,0] and written into memory. The indication that this is a subsequent write, and an index identifying the H matrix are stored as shared data 110, for use by a decoder 108 when the data is read. The decoder 108 multiplies the bits read from the page 306 by the H matrix to determine the read data.

Figure 8:
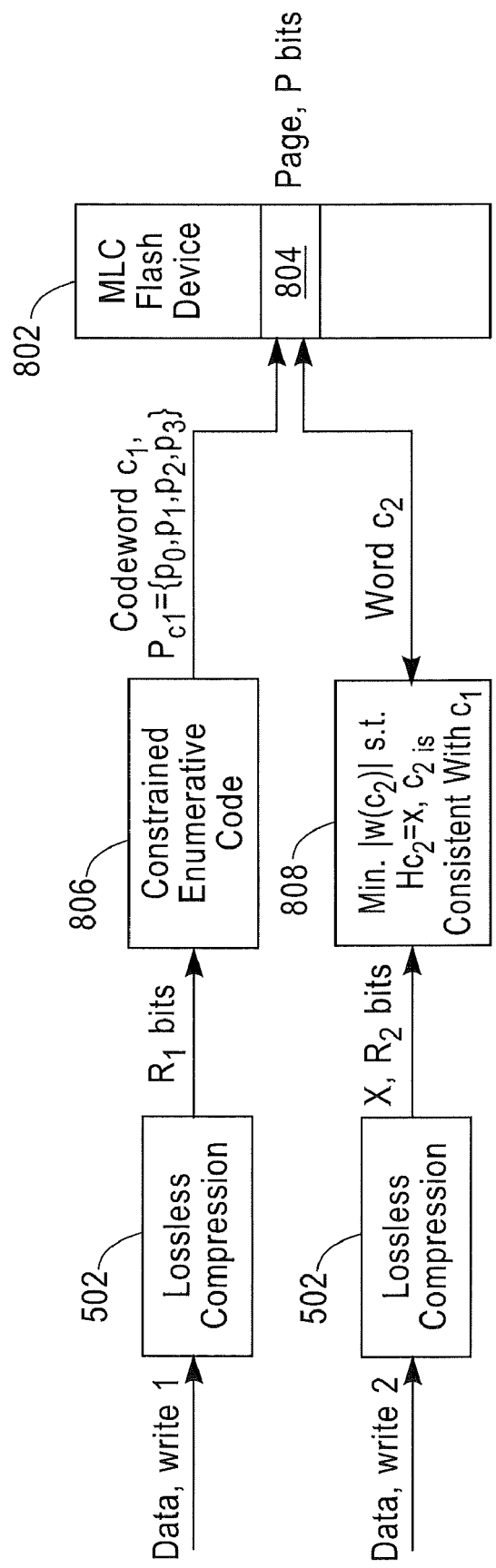
FIG. 8 illustrates a process flow of a multiple-write process that minimizes the wear caused by programming that may be implemented by an exemplary embodiment.

FIG. 8 illustrates a process flow of a multiple-write process that minimizes the wear caused by programming that may be implemented by an exemplary embodiment. In this exemplary embodiment, the memory is a MLC NAND flash device 802, where each cell can be in one of multiple levels. In an exemplary embodiment, the multiple levels are different levels of electrical charge, with ranges of electrical charge levels mapped to data values (e.g., "11" "10" "01" "00").

Figure 9:
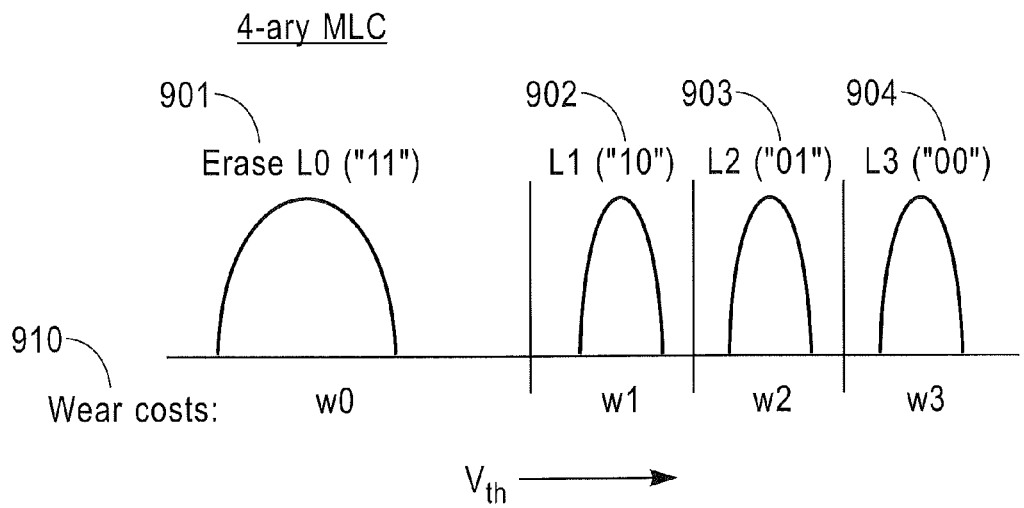
FIG. 9 depicts an example level distribution for a four-level MLC device that may be implemented by an exemplary embodiment.

FIG. 9 depicts an example level distribution for a four-level MLC device that may be implemented by an exemplary embodiment. The level L0 901 with the minimum threshold voltage corresponds to the erase cell-state (also referred to herein as an "erased state") where there is no charge on the floating gate of the cell (i.e., the level of the electrical charge is zero or within a specified range of zero). In an exemplary embodiment, the erased level is represented by the binary string "11". The other three levels L1 902, L2 903, and L3 904 represent the three other states that the cell can be in, corresponding to increasing floating gate charge (and thus increasing threshold voltage or electrical charge levels). In an exemplary embodiment, these are represented by the binary strings "10", "01" and "00" respectively. Each level is associated with a wear cost 910 that represents the amount of damage caused to the cell by programming the level. In an exemplary embodiment, these costs are represented by positive real numbers w0, w1, w2, and w3. Once a cell is programmed to a non-erased level (also referred to herein as a "previously written state"), it can only be reprogrammed to a subset of the other levels without erasure. For example, a cell programmed with level L2 "01" can be left as "L2" or may be reprogrammed to level L3 "00" without requiring erasure; however, if it needs to be reprogrammed to level L0 "11" or level L1 "10" a block erase is required. When a cell is reprogrammed from one level to another level a wear cost is incurred, which can be represented by real numbers $\{w_{ij}\}$ where i and j vary from 0 to 3 (reprogramming operations which are not allowed without block-erase have a wear cost of infinity).

Referring back to FIG. 8, the first write to a page 804 uses lossless compression 502 followed by constrained enumerative coding 806 to generate codeword "$c_1$". The constraint satisfied by the codeword, "$c_1$", is that the frequency distribution $\{p_i\}$ of cell-levels belongs to a set of desired (or target) frequency distributions. In an exemplary embodiment this frequency distribution is computed by determining the distribution which minimizes the weighted sum $\sum(w_i * p_i)$, and is adequate for the data rate i.e. $\sum pi * \log 2(p_i) > R_1/P$. In an exemplary embodiment, this distribution is given as $p_i = \exp(-②w_i)/(\sum \exp(-②w_j))$ with ② selected so that $\sum p_i * \log 2(p_i) = R_1/P + \alpha_R$ for a small, pre-fixed positive number $\alpha_R$.

Figure 10:
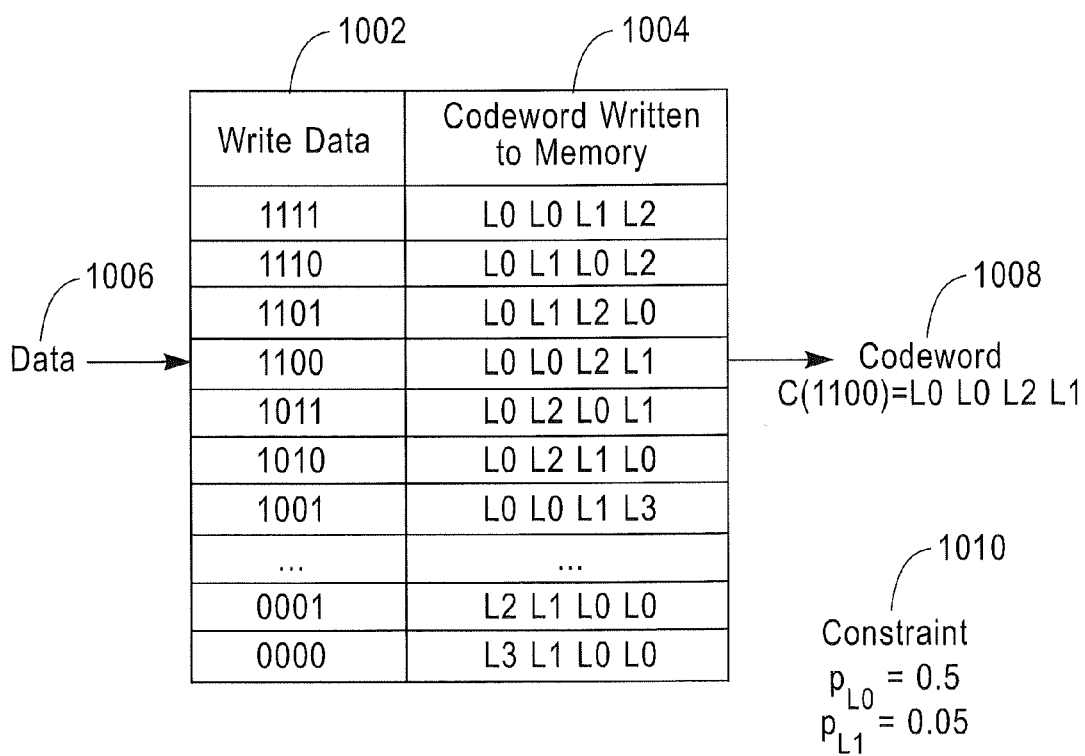
FIG. 10 depicts an exemplary embodiment of a constrained enumerative code that may be implemented by an exemplary embodiment.

FIG. 10 depicts an exemplary embodiment of a constrained enumerative code that may be implemented by an exemplary embodiment. The code is represented by a table indexed by the write data 1002. The column corresponding to write data indices does not need to be stored in memory since it can be computed from the binary data sequence. The contents of the table stored in memory are the column of codewords 1004, consisting of mutually distinct length-P (P=4) 4-ary sequences. Each sequence satisfies the constraint 1010 that 50% of the symbols (two symbols) are levels L0, and 25% (1 symbol) are levels L1 (the remaining element can be L2 or L3). The codeword corresponding to data 1006 is found by reading off the corresponding codeword entry in the table. Thus, for example, the codeword corresponding to data 1100 is the sequence L0, L0, L2 and L1. This codeword is written to the flash memory page 804. In an alternative embodiment P is larger than the length of the codeword, in order to allow error-control code bits to be added to the codeword prior to writing.

In a subsequent re-write to the page 804, the write data is compressed using lossless compression 502, with the resulting compressed data denoted by "X" and made up of "$R_2$" bits. This is followed by computing 808 a codeword "$c_2$" such that "$Hc_2=X$", where "H" is one of a plurality of pre-fixed matrices known to both the encoder and the decoder such that the codeword is consistent with previously programmed cells (i.e., that it does not seek to reprogram a cell to an unattainable level, or only does so a small number of times). The computed codeword is written on the page 804. In the exemplary embodiment, the codeword further satisfies the constraint that it causes the smallest additional wear, computed as a sum of the per-cell reprogram wear ($w_{ij}$) costs. In an exemplary embodiment, H is a random M-ary linear matrix with number of rows equal to the rate of the compressed data, and number of columns equal to the length of the codeword $c_2$.

In another exemplary embodiment, H is the parity check matrix of an M-ary linear error-control code. In an exemplary embodiment, the length of the codeword, $c_2$, is less than the page size to allow subsequent error-control coding to be done. In another exemplary embodiment, the codeword, $c_2$, may span multiple physical pages as such an expansion may allow a smaller number of total cells to be programmed. The codeword, $c_2$, can be found by an exhaustive search, or by techniques such as integer optimization known in the art. During the read process, a decoder, such as decoder 108, recovers the data rewritten onto the page by multiplying the codeword $c_2$ (read from the page) by the pre-specified matrix H. In an exemplary embodiment, the lossless compression 502 is optional, and the data for write 1 has $R_1$ bits and the data for write 2 ahs $R_2$ bits.

Figure 11:
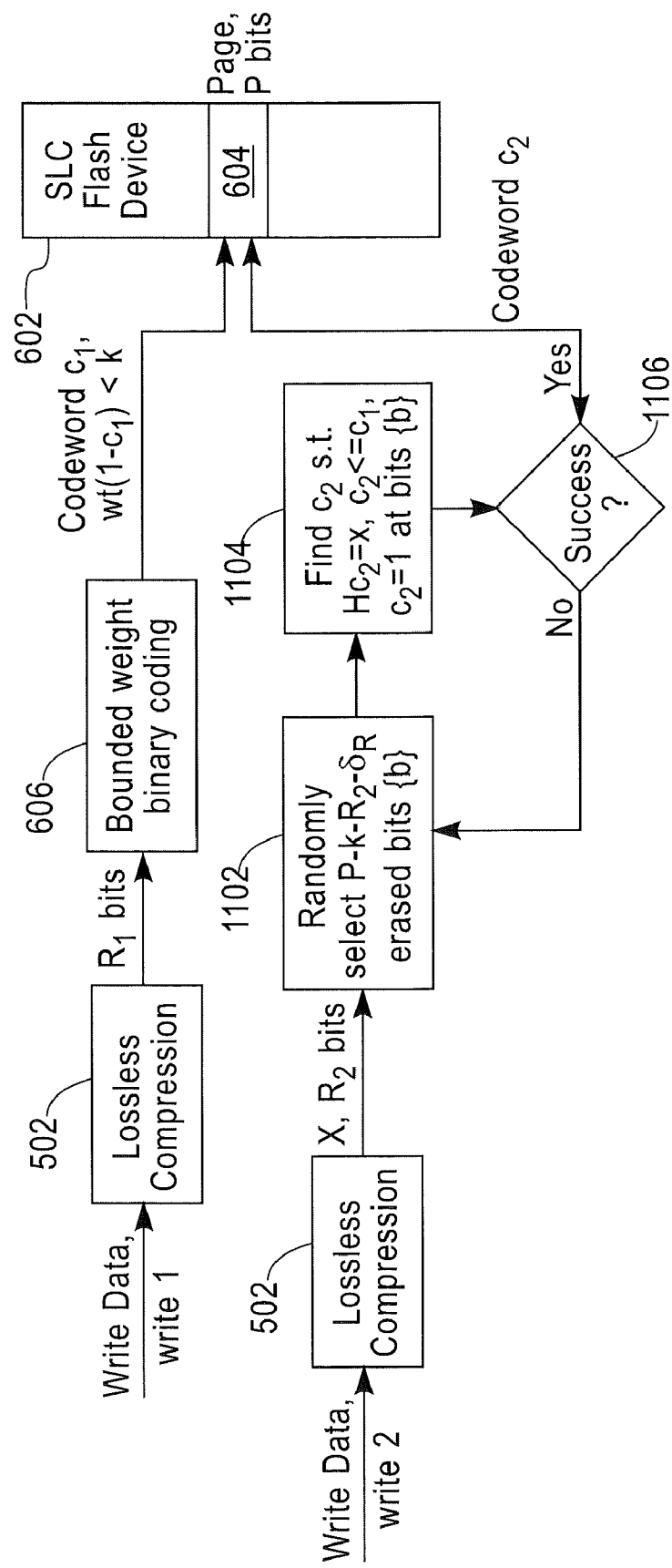
FIG. 11 illustrates a process flow of a simplified multiple-write process that may be implemented by an exemplary embodiment.

FIG. 11 illustrates a process flow of a multiple-write process that selects the first codeword in the same manner as the process depicted in FIG. 6, however the selection of the second codeword is a simplified when compared to the process in FIG. 6, at the expense of a larger number of programmed cells. In the exemplary embodiment depicted in FIG. 11, the memory is a SLC NAND flash device 602, and the first write uses lossless compression 502 followed by bounded weight binary coding 606 to generate codeword $c_1$, wherein the constraint satisfied by the codeword is that the number of programmed cells is bounded by a pre-specified constant k.

In a subsequent rewrite to the page 604, the data is compressed using lossless compression 502, with the resulting compressed data denoted by X, and containing $R_2$ bits. A sub-page out of the page 604 consisting of a possibly non-contiguous set of P-k-$R_2$-$\alpha_R$ erased bits is selected, and then a second codeword $c_2$ is found such that $Hc_2=X$, wherein H is one of a plurality of pre-fixed matrices, and such that $c_2$ is consistent with previously programmed cells, and such that the selected $P-k-R_2-\alpha_{R_R}$ sub-page bit-positions remain erased in the codeword $c_2$. In the case that such a $c_2$ cannot be found, the rewrite encoder selects a different set of $P-k-R_2-\alpha_R$ bits and repeats the process. This is performed until the write is successful or until a fixed number of attempts are completed. If no solution is found after a fixed number of attempts, the number of fixed-bits can be decreased and/or a different H matrix can be used, or the data can be attempted to be written to a different physical page. The value written into the page 604 can be read by computing $Hc_2$ where $c_2$ is the codeword written into memory. The main advantage of this method is the lower complexity of programming when compared to the process depicted in FIG. 6, since it requires the solution of a linear system of equations. This method typically results in a larger number of programmed cells than the method in FIG. 6, but nevertheless ensures that only $\sim R_2/2$ bits are programmed rather than (P-k)/2 as would be the case for naïve encoding. Further, the positions of the $P-k-R_2-\alpha_R$ erased bits is not required to be stored, and re-tries can be easily performed if no codeword is found. The lossless compression is optional, and can be removed if needed.

An example of the process depicted in FIG. 11 follows. This example is for explanation purposes and uses write data with only four bits (e.g., P is equal to four). In an actual implementation P is much larger than four (e.g., the number of bits in a page or half page). In this example, in the first write, four bits of write data are compressed, using the lossless compression 502, into compressed data, "X", made up of two bits (e.g., R is equal to two). Thus, in an exemplary embodiment, the bounded weight binary coding 606 will use a table made up of four entries (i.e., two raised to the "R" entries). In this example, the mapping from X into $c_1$ includes: "00"→"1111"; "01"→"1110", "10"→"1101", and "11"→"1011". In this example, the codeword was selected to minimize the number of 0s (or programmed cells). Thus, in this example "k" is equal to two, and $wt(1-c_1)$ is less than two. The mapping is stored as shared data along with an indication that this is a first write for use by a decoder when the data is read.

In the second (or subsequent) write, four bits of write data are compressed, using the lossless compression 502, into compressed data, "X", made up of two bits (e.g., R is equal to two). In this example, it is assumed that the first codeword, $c_1$, written to the page 604 was the codeword "1110". This implies that the codeword of a subsequent write must have a "0" in the last position (i.e., because once a cell is programmed with a "0" value, it must be erased to go back to a value of "1"). It is assumed that the compressed version of the write data for the second write has a value of "01". It is also assumed that the shared 2×4 H matrix for $R_2$=2 has a first row equal to [1,1,0,1] and a second row equal to [1,0,1,0]. The value of "01" is input to the random selection 1102 which randomly selects one bit in the second codeword to have the value "1" (e.g., bit 2) given that the last bit has to have the value "0". This is input to the computing 1104 to see if a word can be found that satisfies the equation $Hc_2$="X", with the constraint that the fourth position of $c_2$ is a "0", and that position two is a "1". Word $c_2$[1,1,0,0] satisfies $Hc_2$=X and is consistent with both constraints. Thus it is written to the page 604. The indication that this is a subsequent write, and an index identifying the H matrix are stored as shared data, for use by a decoder when the data is read. The decoder multiplies the bits read from the page 306 by the stored H matrix to determine the read data.

If a codeword had not been found, as determined at block 1106, then the random selection 1102 would be performed again to place the fixed erased values in different positions. In an exemplary embodiment, if a codeword cannot be found in a fixed number of attempts, then the random selection 1102 may decrease the number of fixed erased bits to zero and continue looping to find a codeword $c_2$ that satisfies the constraints.

Figure 12:
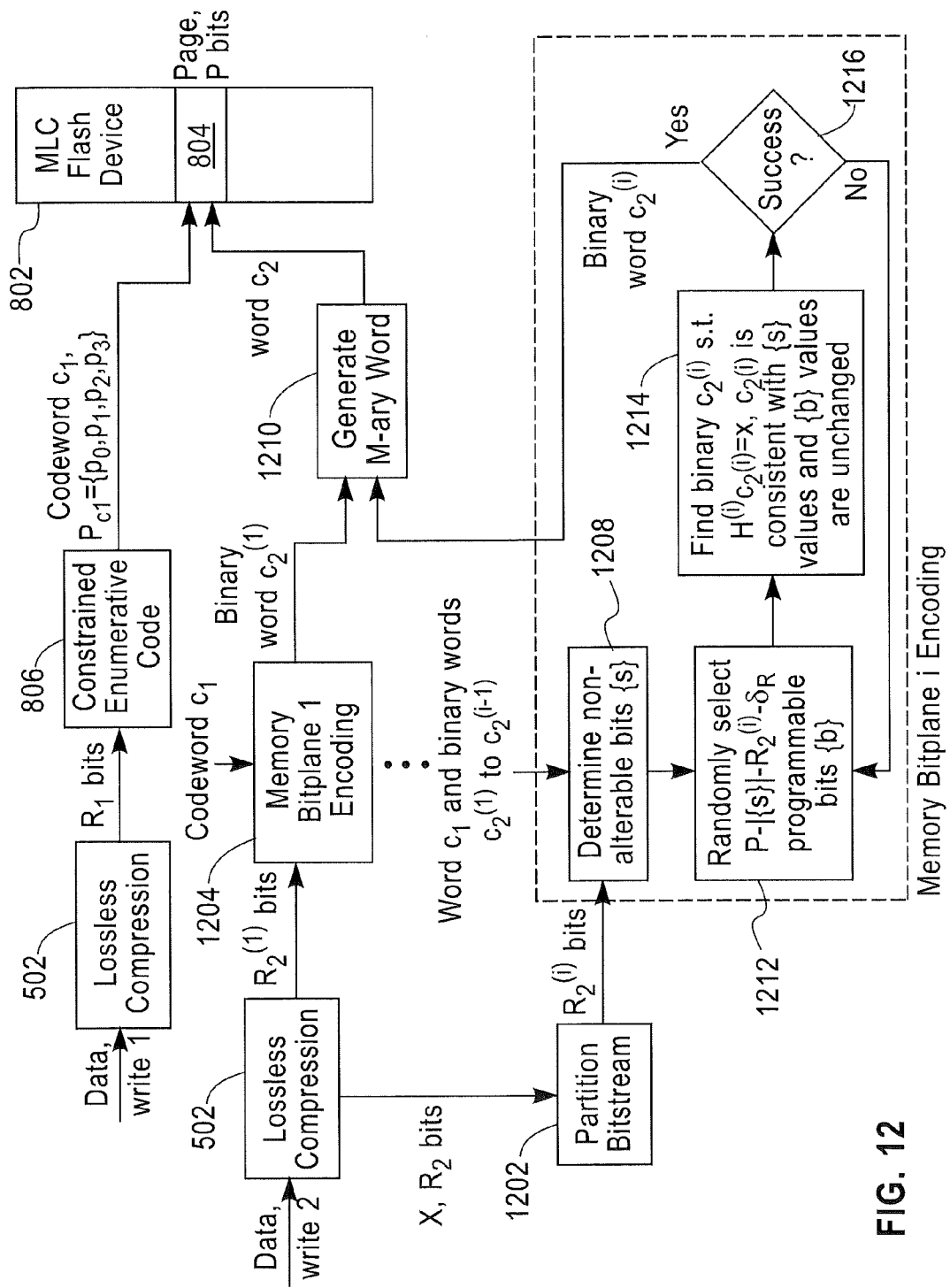
FIG. 12 illustrates a process flow of a multiple-write process that may be implemented by an exemplary embodiment.

FIG. 12 illustrates for a MLC NAND flash memory, an exemplary process flow of a multiple-write process that selects the first codeword in the same manner as the process depicted in FIG. 8, however the selection of the second codeword is simplified when compared to the process in FIG. 8, at the expense of a greater wear. In the exemplary embodiment depicted in FIG. 12, the memory is a four-level MLC NAND flash device 802 with exemplary levels as in FIG. 9. The first write to a page 804 uses lossless compression 502 followed by constrained enumerative coding 806 to generate codeword "$c_1$". The constraint satisfied by the codeword, "$c_1$", is that the frequency distribution $\{p_i\}$ of cell-levels belongs to a set of desired frequency distributions. In an exemplary embodiment this frequency distribution is computed by determining the distribution which minimizes the weighted sum $\boxtimes(w_i*p_i)$, and is adequate for the data rate i.e. $\boxtimes p_i*\log_2(p_i) > R_1/P$. In an exemplary embodiment, this distribution is given as $p_i = \exp(-\textcircled{2}w_i)/(\boxtimes\exp(-\textcircled{2}w_i))$ with $\textcircled{}$ selected so that $\boxtimes p_i*\log_2(p_i) = R_1/P + \alpha_R$ for a small, pre-fixed positive number $\alpha_R$.

In a subsequent rewrite to the page 804, the data is compressed using lossless compression 502, with the resulting compressed data denoted by X, and containing $R_2$ bits. Next, the data is partitioned 1202 into multiple, mutually exclusive, binary subsequences. For a memory with M level cells, $\log_2(M)$ such sequences are generated. The M-level memory is thought of as consisting of $\log_2(M)$ binary memories, each binary memory corresponding to one bit-plane (also referred to herein as "binary memory planes") of the M-ary memory. The first subsequence, denoted $X^1$ and consisting of $R_2^{(1)}$ bits is encoded 1204 so as to generate the binary codeword $c_2^{(1)}$ which is written to the first bit-plane of the memory. In general, the $i^{th}$ subsequence $X^i$ consisting of $R_2^{(i)}$ bits is encoded 1206 so as to generate the binary word $c_2^{(i)}$ which is written to the $i^{th}$ bit-plane of the memory. The page-size P is greater than $R_2^{(j)}$ bits for all j from 1 to $\log_2(M)$. The $i^{th}$ binary word $c_2^{(i)}$ is generated as follows.

Based on the previous content of the memory $c_1$ and encoded binary codewords $c_2^{(1)}$ to $c_2^{(i-1)}$ which are to be written to the first (i-1) bitplanes, certain bit positions in the $i^{th}$ bitplane will be non-alterable (i.e. their value is either fixed at 0 or at 1). These positions, denoted by the set $\{s\}$, are determined 1208 based on $c_1$ and the computed words $c_2^{(1)}$ to $c_2^{(i-1)}$. Next, from the remaining $P-|\{s\}|$ bit positions, a sub-page consisting of a possibly non-contiguous set of $P-|\{s\}|-R_2^{(i)}-\alpha_R$ bits is selected 1212. This set is denoted by "$\{b\}$". A codeword $c_2^{(1)}$ is now found such that $H^{(i)}c_2^{(i)}=X^{(i)}$, where $H^{(i)}$ is one of a plurality of pre-fixed binary matrices, and such that $c_2^{(i)}$ is consistent with the fixed values at the bit locations $\{s\}$ and $\{b\}$ (i.e. it does not change the previous values in these locations, or does so for at most a small number of such locations) 1214. In the case that such a $c_2^{(i)}$ cannot be found, the rewrite encoder selects a different set of $P-|\{s\}|-R_2^{(i)}-\alpha_R$ bits and repeats the process. This is performed until the write is successful 1216 or until a fixed number of attempts are completed. If no solution is found after a fixed number of attempts the number of fixed-bits can be decreased and/or a different $H^{(i)}$ matrix can be used, or the data can be attempted to be written to a different physical page.

Once all $\log_2(M)$ codewords $c_2^{(i)}$ have been computed they are combined to form the M-ary word which is then written into the page 804. In an exemplary embodiment, the combining 1210 is performed as follows; the M-ary level to be programmed into the $j^{th}$ page cell is given by $\boxtimes c_2^{(i)}(j)2^{i-1}$. The value written into the page 804 can be read by decomposing the read data into bitplanes and computing $H^{(i)}c_2^{(i)}$ for each bitplane. The main advantage of this method is the lower complexity of programming when compared to the process depicted in FIG. 12, since it requires the solution of linear systems of equations. In one embodiment, the matrices $H^{(i)}$ are random binary linear matrices. In another exemplary embodiment, they are parity check matrices of binary linear error-control codes. The lossless compression 502 step is optional, and is not performed in an exemplary embodiment.

An example of the process depicted in FIG. 12 follows. This example is for explanation purposes and assumes a page with four 4-level cells (e.g., P is equal to four). In an actual implementation P is much larger than four (e.g., the number of bits in a page or half page). Assume that the four levels of the memory represent the binary strings shown in FIG. 9 (i.e. L0 is "11", L1 is "10" etc.). Further, each level can be reprogrammed to a level to the right of it without a block-erase, but cannot be reprogrammed to a level to the left of it without a block-erase. Thus, for example, level L1 can be reprogrammed to L2 or L3 without an erase (and, obviously can be left as L1 in a reprogramming step), but reprogramming it to L0 would first require a block erase. Assume, for this example, that in the first write the codeword $c_1=\{L0, L0, L2, L1\}$ is written onto page 804. It is now described how the second write is performed.

Assume that the data in write 2 after compression is given by the four-bit binary sequence $\{0,1,1,1\}$, which is now to be stored in memory. The compressed data sequence is first partitioned into two subsequences namely $X^{(1)}=\{0,1\}$ and $X^{(2)}=\{1,1\}$. The first subsequence is to be written into the first bitplane (least significant bitplane) of the memory. The current content of the first bitplane after writing $c_1$ is given by $\{1,1,1,0\}$. Since $c_1=\{L0, L0, L2, L1\}$, all four bit-positions in the first bitplane can be programmed to a 0 or a 1. For example, the first bit of the third cell can be programmed to a 0 by changing the cell level from L2 to L3, and it can be programmed to a 1 by leaving the level unchanged as L2. Similarly, the first bit of the first cell can be programmed to a 0 by changing the cell level to L1 or L3, and can be programmed to a 1 by changing the cell level to L0 or L2. Let $H^{(1)}$, the H matrix for the first bitplane, be a 2×4 matrix with a first row equal to [1,1,0,1] and a second row equal to [1,0,1,0]. The value of $X^{(1)}$="01" is input to the random selection 1212 which randomly selects two bits to remain fixed to their current value (e.g., bit 2 and bit 3). This is input to the computing 1214 to see if a word can be found that satisfies the equation $H^{(1)}c_2^{(1)}=X^{(1)}$, with the constraint that the second and third positions are a "1". Word $c_2^{(1)}=[0,1,1,1]$ satisfies $H^{(1)}c_2^{(1)}=X^{(1)}$ and is consistent with the desired constraints.

Next, the binary codeword corresponding to the second subsequence $X^{(2)}=\{1,1\}$ is computed, for writing into the second bitplane. Given the codeword $c_1$ and the computed codeword $c_2^{(1)}$ it is computed 1208 that the second and third cells can only contain the level L2. Thus, the third and fourth bits in the second bitplane are unalterably fixed to "0". The value of $X^{(2)}$="11" is input to the random selection 1102, which does not select any additional bits to remain fixed. This is input to the computing 1210 to see if a word can be found that satisfies the equation $H^{(2)}c_2^{(2)}=X^{(2)}$, with the constraint that the third and fourth positions are a "0". If $H^{(2)}=H^{(1)}$, word $c_2^{(2)}=[1,0,0,0]$ satisfies $H^{(2)}c_2^{(2)}=X^{(2)}$ and is consistent with the desired constraints. Finally, the two computed binary words $c^{(1)}$ and $c^{(2)}$ are combined to form the M-ary word to be programmed into memory. The first cell should have level "$c_2^{(2)}(1)c_2^{(1)}(1)$"="10" (i.e. level L1 written to it). Similarly, the second cell should have level "$c_2^{(2)}(2)c_2^{(1)}(2)$"="01" (i.e., level L2 written to it). Similarly the third and fourth cells should also have level L2 written to them. Thus, the M-ary word to be written to the memory in the second write is $c_2=[L1,L2,L2,L2]$. It is easy to verify from $c_1$ and $c_2$ that it is indeed possible to do the rewrite without a block-erase. The indication that this is a subsequent write, and an index identifying the H matrix are stored as shared data, for use by a decoder when the data is read. The decoder decomposes the read word [L1,L2,L2,L2] into its constituent bitplanes yielding $c_2^{(1)}=[0,1,1,1]$ and $c_2^{(2)}=[1,0,0,0]$ and multiplies each by the corresponding H matrix to obtain the two subsequences. These two subsequences are then concatenated and decompressed to obtain the original write data.

Figure 13:
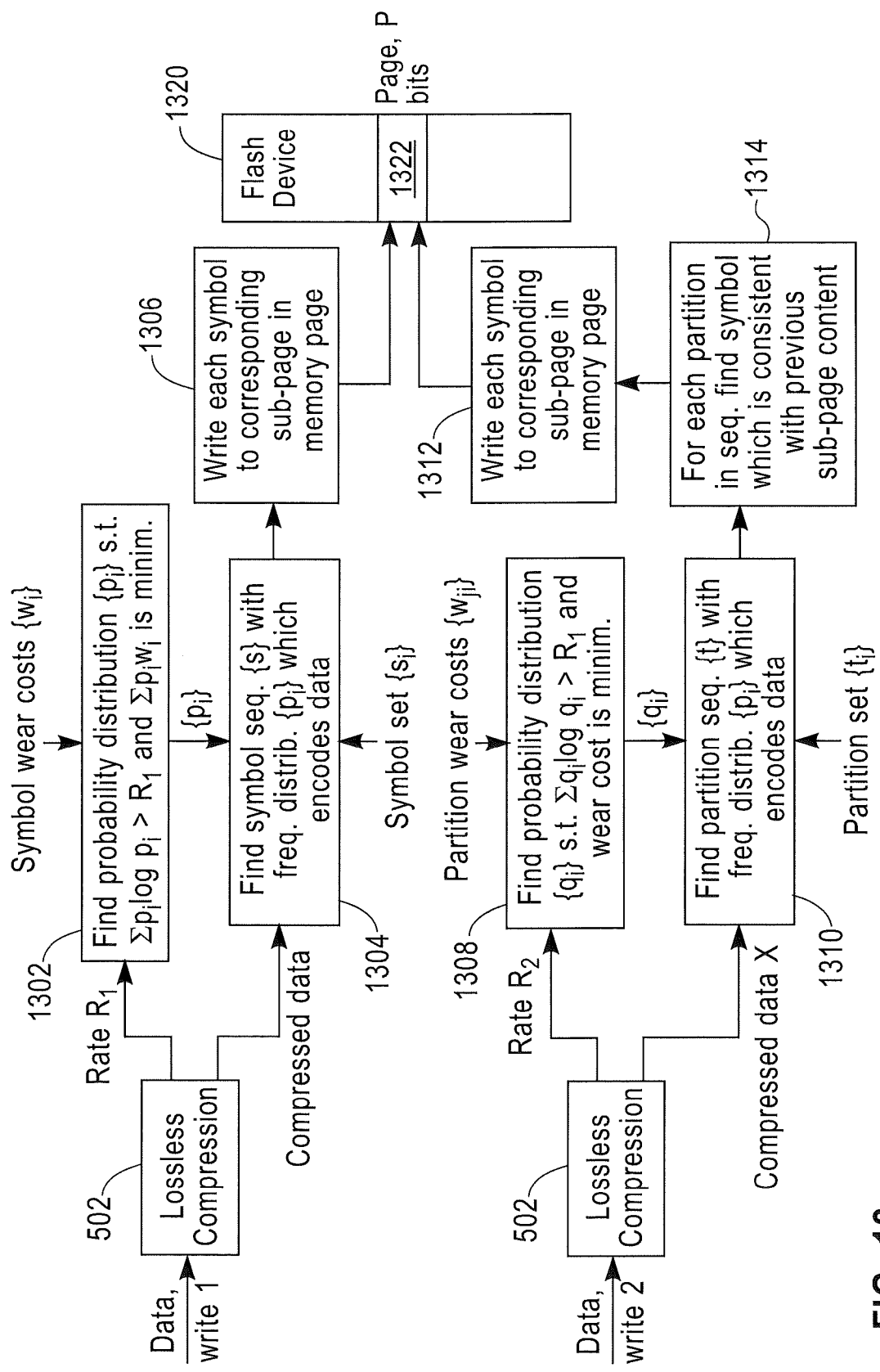
FIG. 13 illustrates a process flow of an exemplary embodiment of a multiple-write process that uses sub-pages and probability distributions to generate codewords.

FIG. 13 illustrates a process flow of an exemplary embodiment of a multiple-write process that uses sub-pages and probability distributions to generate codewords. In this embodiment, the page 1322 in a device 1320 (e.g., a flash device) is subdivided into smaller sub-pages prior to writing, where each sub-page contains a plurality of physical cells. The code used in the first write consists of a set of sub-page symbols $\{s_i\}$ with wear cost $\{w_i\}$, where each $w_i$ is a nonnegative real number. In an exemplary embodiment, the device 1320 is an SLC device, and $w_i$ is the number of cells required to be programmed in order to write symbol $s_i$ onto a sub-page. In an alternate exemplary embodiment, the device 1320 is an MLC device, and $w_i$ is the average wear cost of the plurality of MLC levels which constitute the sub-page symbol $s_i$. As shown in FIG. 13, first the write data is compressed using lossless compression 502. The data rate of the compressed data (e.g., the number of bits in the compressed data) and the symbol wear costs, $\{w_i\}$, are input to block 1302. To write the compressed data, the logic in block 1302 computes a probability distribution $\{p_i\}$ over the set of sub-page symbols such that the sum of $p_i \log 2(p_i)$ is slightly higher than the per-symbol data rate of the compressed data, and such that the page wear cost (computed for example as the sum of $p*w_i$) is minimized Next, at block 1304, a constrained enumerative code is used to encode the data into a sequence of sub-page symbols such that the frequency distribution of written sub-page symbols follows the computed probability distribution. In an exemplary embodiment, this is done by using a code similar to the code in FIG. 10, with the second column populated with those sequences of sub-page symbols (symbols from the set $\{s_i\}$) that have the desired frequency distribution. The output of the computation block 1304 is a sequence of sub-page symbols; at block 1306, the computed sub-page sequence (i.e., the codeword) is written onto the memory page 1322 in the device 1320, by writing each element symbol of the symbol sequence onto its corresponding sub-page (i.e. element sub-page symbol 1 ("1e") is written onto sub-page 1 ("1sp"), element sub-page symbol 2 ("2e") is written onto sub-page 2 ("2sp") and so on).

For the second (or other subsequent) write, the code consists of a set of partition sets $\{t_i\}$, each partition set $t_i$ containing a plurality of sub-page symbols (which may be different from the sub-page symbols used in the first or other previous steps), and such that the partition sets are mutually non-overlapping. Denote by $w_{ji}$ the minimum wear cost associated with reprogramming a previously programmed sub-page symbol $s_j$ to a sub-page symbol from partition set $t_i$. The write data is compressed using lossless compression 502. At block 1308, given the compression rate $R_2$ (or data rate, if compression is not used) a probability distribution $\{q_i\}$ is found, such that sum of $q_i \log_2(q_i)$ is slightly higher than the per-symbol data rate (which ensures that compressed data can be encoded), while minimizing the expected reprogramming wear cost, which is a function of the costs $\{w_{ji}\}$, the frequency distribution of the previous content of the page, and the distribution $\{q_i\}$. Next, at block 1310, a constrained enumerative code is used to encode the data into a sequence of partition set indices (indices of the elements of the set of partition sets $\{t_i\}$) such that the frequency of the partition set indices follows the computed distribution. In an exemplary embodiment, this is done by using a code similar to the code in FIG. 10, with the second column populated with those sequences of partition set indices that have the desired frequency distribution. The output of the computation block 1310 is a sequence of partition indices. At block 1314, for each sub-page a symbol is found from the corresponding partition set index in the partition index sequence, which is consistent with the previous content of the sub-page. The output of block 1314 is thus a sequence of sub-page symbols. At block 1312, this computed sub-page sequence is written onto the memory page 1322 in the device 1320, by reprogramming each sub-page to the element symbol of the symbol sequence (i.e. sub-page 1 ("1sp") is reprogrammed to element sub-page symbol 1 ("1e"), sub-page 2 ("2sp") is reprogrammed to element sub-page symbol 2 ("2e") and so on).

The decoder reads the sub-page symbol sequence from the memory page. Since the partition sets are mutually non-overlapping, the decoder can compute the corresponding partition index sequence. From this, and knowledge of the enumerative code, the decoder can decode the data.

In an exemplary embodiment, for a two-write case with rates $R_1$ and $R_2$ for the first and second writes, where both rates are known prior to the first write (as may be the case in a system with a small discrete number of write rates), the probability distributions are computed as $p_i = \exp\{-②1*(w_i + ⊠q_j w_{ij})\}/Z1$ and $q_j = \exp(-②2* ⊠p_i w_{ij})/Z2$ where Z1 and Z2 are normalizing factors, and ②1 and ②2 are selected so as to meet the rate requirements. In an alternative embodiment, while writing the first write, only R1 is known and $p_i = \exp(-②1*w_i)/Z$ where Z is a normalizing factor and ②1 is selected so as to meet the required rate; the distribution $\{q_j\}$ is computed as above.

An example of the process depicted in FIG. 13 follows. This example is for explanation purposes and assumes an SLC NAND flash device. The pages are split into two-bit sub-pages, and the lossless compression 502 results in two bits for each write, and a codeword of eight bits (e.g., four sub-pages). In an actual implementation, these numbers would likely increase (e.g., a codeword would contain a page or a half page worth of bytes, each sub-page would contain eight bits etc.).

In this example, the symbol set for the first write (each symbol having bits equal to the number of bits on one sub-page) includes $\{s_i=11, s_2=10\}$. Since the device is SLC, the associated wear costs are $\{w_1=0, w_2=1\}$. Assuming that at the time of the first write only the rate $R_1=2$ bits is known. A probability distribution which allows two bits to be encoded while minimizing the wear cost is $\{p_1=0.75, p_2=0.25\}$. Thus, in order to minimize the wear cost, block 1302 assigns a probability of seventy-five percent to $s_1$ and a probability of twenty-five percent to $s_2$. This means, that in each codeword to be written to the page 1322 during a first write (i.e., the page is an erased page), seventy-five percent of the sub-pages should be written with the bits "11" and twenty-five percent of the sub-pages should be written with the bits "10". The probabilities and their association to particular symbol sets described herein are intended to be examples only, as other symbol sets and percentages may also be implemented by exemplary embodiments. At block 1304, the compressed data is mapped to the symbols. In one example the mapping from compressed data bits to codeword is as follows: "00"→"$s_1 s_1 s_1 s_2$"; "01"→"$s_1 s_1 s_2 s_1$"; "10"→"$s_1 s_2 s_1 s_1$"; and "11"→"$s_2 s_1 s_1 s_1$". This is an example of one mapping that meets the requirement that seventy-five percent of the sub-pages should be written with the bits "11" and twenty-five percent of the sub-pages should be written with the bits "10". At block 1306, the computed codeword is written to memory.

For the second, or subsequent write, an exemplary set of partitions has two partition set elements $\{t_1, t_2\}$ which are defined as: $t_1 = \{00\}$ and $t_2 = \{11, 00, 10\}$ (note that this partition selection is only for the purpose of illustration; this exemplary partition would not be the best in practice). The minimum wear cost of reprogramming symbol $s_1$ to a symbol from the partition set $t_1$ is 1 (since reprogramming 11 to 00 requires 2 additional cells to be programmed). Thus the cost $w_{11}=2$. Similarly $w_{12}=0$, $w_{21}=1$, and $w_{22}=0$. A probability distribution which allows two bits to be encoded while minimizing the expected wear cost (given by $⊠_i p_i ⊠_j q_j w_{ij}$) is $\{q_1=0.25, q_2=0.75\}$. Thus, block 1310 assigns a probability of seventy-five percent to partition set $t_1$ and a probability of twenty-five percent is assigned to set $t_2$. This means, that in each codeword to be written to the page 1322 during the second write, twenty-five percent of the sub-pages should be written with the bits "00", and seventy-five percent of the sub-pages should be written with the bits "11", "10" or "01". The probabilities and their association to particular symbol sets described herein are intended to be examples only, as other symbol sets and percentages may also be implemented by exemplary embodiments At block 1310, the compressed data is mapped to the partitions. In one example, the mapping from compressed data bits to codeword is as follows "00"→"$t_2 t_2 t_2 t_2$"; "01"→"$t_2 t_2 t_2 t_1$"; "10"→"$t_2 t_2 t_1 t_2$"; and "11"→"$t_2 t_1 t_2 t_2$". This is an example of one mapping that meets the requirement that seventy-five percent of the sub-pages should be written with symbols from set $t_2$ and twenty-five percent of the sub-pages should be written with symbols from set $t_1$.

At block 1314, symbols that are consistent with the previous write(s) are selected from each set. For example, assume that the first write was the compressed value "00" translated to the codeword "$s_2 s_1 s_1 s_1$" and written to the page 1322 as "10 11 11 11" and the second write is the compressed value "10". For the second write, assuming that the mapping above is used, the compressed value of "10" is translated to the sets "$t_2 t_2 t_1 t_2$". A symbol that is consistent with the data values currently stored in first sub-page written in the first write ("10") and that has the fewest number of zeros is selected from set $t_2$. In this case, the symbol "10" is selected because it does not require any additional bit to be programmed, and is consistent with the symbol from the first-write. Similarly, a symbol that is compatible with the data values currently stored in third sub-page written in the first write ("11") and that has the fewest number of zeros is selected from set $t_1$ for writing onto the third sub-page. In this case, the symbol "00" is the only symbol in set $t_1$ and is consistent with the symbol from the first-write. In this manner, symbols are selected for each sub-page, resulting, in this case in codeword "10 11 00 11". At block 1312, the codeword is written to memory.

In an exemplary embodiment, the NAND flash device is SLC flash, the sub-page size is 2 bits, the symbol set for the first write is 111,10,011, and the two partition sets for the second write are $\{00,11\}$ and $\{01,10\}$. In another exemplary embodiment, the NAND flash device is SLC flash, the sub-page size is 3 bits, the symbol set for the first write is $\{$111, 110, 101, 011}, and the four partition sets for the second write are {111,110,001}, {101,010}, {011,100}, and {000}. In another exemplary embodiment, the NAND flash device is SLC flash, the sub-page size is 4 bits, the symbol set for the first write is 11111, 1110, 1101, 1011, 0111, 1100, 1010, 0101, 00111, and the four partition sets for the second write are {0100 0011 1010 1101 1111}, {0010 1100 0101 1110}, {0001 1000 1011 0110}, {0000 1001 0111}. It is straightforward to extend these to the case of an MLC flash device.

In alternate exemplary embodiments, a reserved symbol is utilized to simplify the code design. In this embodiment, the first write uses unconstrained or constrained coding; and the second write uses a partition based code as described previously, however certain sub-pages may be un-encodable. For un-encodable sub-pages, a special reserved symbol (e.g., all zeros) is used to signal the decoder.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer implemented method for storing data comprising:
   receiving write data;
   receiving a write address of a memory page, the memory page being in either an erased state or a previously written state, the memory page associated with a plurality of memory cells having electrical charge levels;
   in response to the memory page being in the erased state:
      selecting a first codeword such that the first codeword encodes the write data and is consistent with a target set of distributions of electrical charge levels in the memory page; and
      writing the first codeword to the memory page; and
   in response to the memory page being in the previously written state:
      selecting a coset from a linear code such that the coset encodes the write data and includes one or more words that are consistent with previously written content of the memory page;
      selecting a subsequent codeword from the one or more words in the coset; and
      writing the subsequent codeword to the memory page.

2. The method of claim 1, wherein the first codeword is further selected such that less than a threshold number of bits are programmed during the writing of the first codeword, the threshold number of bits determined in response to a data rate of the write data and the size of the memory page.

3. The method of claim 1, wherein the first codeword is further selected such that less than a threshold wear cost is incurred during the writing of the first codeword, the threshold wear cost determined in response to a data rate of the write data and the size of the memory page.

4. The method of claim 1, wherein the subsequent codeword is selected such that less than a threshold number of bits are programmed during the writing of the subsequent codeword, the threshold number of bits determined in response to a data rate of the write data and the size of the memory page.

5. The method of claim 1, wherein the subsequent codeword is selected such that less than a threshold wear cost is incurred during the writing of the first codeword, the threshold wear cost determined in response to a data rate of the write data and the size of the memory page.

6. The method of claim 1, wherein the write data is compressed prior to one of selecting the first codeword and selecting the subsequent codeword.

7. The method of claim 1, wherein the subsequent codeword is selected such that a selected subset of erased cells in the memory page remain unchanged after the subsequent codeword is written to the memory page.

8. The method of claim 7, wherein the size of the selected subset is determined prior to selecting the subsequent codeword, the size of the selected subset determined in response to the memory page size, any previously programmed memory cells, and the number of bits to be stored in the writing of the subsequent codeword, and wherein the selected subset is selected at random from a set of erased page cells.

9. The method of claim 1, wherein the selecting the subsequent codeword includes:
   decomposing the memory cells into a plurality of binary memory planes; and
   performing for each of the binary memory planes:
      determining bit positions in the binary memory plane that cannot be changed, the determining responsive to previous content of the memory page and to any previously selected subsequent binary memory plane codewords;
      fixing values at one or more of the bit positions in the binary memory plane that can be changed;
      selecting a subsequent binary memory plane codeword from the one or more words in the coset that are consistent with the bit positions in the binary memory plane that cannot be changed and which leaves the fixed values unchanged; and
      outputting a sequence of the selected subsequent binary memory plane codewords as the subsequent codeword.

10. A computer implemented method for storing data comprising:
    receiving write data;
    receiving a write address of a memory page, the memory page being in either an erased state or a previously written state, the memory page associated with a plurality of memory cells having electrical charge levels;
    separating, at a computer, the memory page into a plurality of sub-pages;
    in response to the memory page being in the erased state:
       selecting a sequence of first sub-page symbols, the selecting including selecting a first sub-page symbol from a set of first sub-page symbols for each of the sub-pages such that the sequence of first sub-page symbols encodes the write data and is consistent with a target set of distributions of the first sub-page symbols over the memory page; and
       writing the sequence of first sub-page symbols to the memory page; and
    in response to the memory page being in the previously written state:
       selecting a sequence of subsequent partition indices, the selecting including selecting a subsequent partition index from a set of subsequent partition indices for each of the sub-pages in the memory page such that the sequence of partition indices encodes the write data and is consistent with a target set of distributions of subsequent partition indices;
       selecting, for each of the sub-pages in the memory page, a subsequent sub-page symbol which is consistent with previous content of the sub-page, the subsequent sub-page symbol selected from a partition corresponding to the subsequent partition index selected for the sub-page; and writing the subsequent sub-page symbols to the memory page.

11. The method of claim 10, wherein the target set of distributions of first sub-page symbols is selected such that less than a threshold number of bits are programmed during the writing of the sequence of first sub-page symbols, and wherein the threshold number of bits is determined in response to a data rate of the write data and the size of the memory page.

12. The method of claim 10, wherein the sequence of first sub-page symbols is further selected such that less than a threshold wear cost is incurred during the writing of the sequence of first sub-page symbols, the threshold wear cost determined in response to a data rate of the write data and the size of the memory page.

13. The method of claim 10, wherein the target set of distributions of subsequent partition indices is selected such that less than a threshold number of bits are programmed during the writing of the subsequent sub-page symbols, and wherein the threshold number of bits is determined in response to a data rate of the write data and the size of the memory page.

14. The method of claim 10, wherein the target set of distributions of subsequent partition indices is selected such an estimate of the number of bits to be programmed during the writing of the subsequent sub-page symbols is less than a threshold, and wherein the threshold number of bits is determined in response to a data rate of the write data and the size of the memory page.

15. The method of claim 10, wherein the target set of distributions of subsequent partition indices is selected such that less than a threshold wear cost is incurred during the writing of the subsequent sub-page symbols, and wherein the threshold wear cost is determined in response to a data rate of the write data and the size of the memory page.

16. The method of claim 10, wherein the target set of distributions of subsequent partition indices is selected such that an estimate of the wear cost to be incurred during the writing of the subsequent sub-page symbols is less than a threshold wear cost, and wherein the threshold wear cost is determined in response to a data rate of the write data and the size of the memory page.

17. The method of claim 10, wherein the write data is compressed prior to one of selecting a sequence of first sub-page symbols and selecting a sequence of subsequent partition indices.

18. A computer implemented method for storing data comprising:
receiving write data, the write data having a data rate;
receiving a write address of a memory page, the memory page associated with a plurality of memory cells, the memory page being in one of an erased state and a previously written state;
in response to the memory page being in the erased state:
selecting, at a computer, a first code in response to the data rate and to a target number of memory cells to be programmed in a first write;
applying, at the computer, the first code to the write data to generate a first codeword; and
writing the first codeword to the memory page; and
in response to the memory page being in the previously written state:
selecting, at the computer, a subsequent code in response to the data rate, to a target number of memory cells to be programmed in a subsequent write, to current contents of the memory cells in the memory location, and to a constraint that any of the memory cells that are currently programmed in the memory page remain programmed when the subsequent code is applied to the write data;
applying, at the computer, the subsequent code to the write data to generate a subsequent codeword; and
writing the subsequent codeword to the memory location, thereby allowing the memory page to be written multiple times between erasures.

19. The method of claim 18, wherein the write data is compressed.

20. The method of claim 18, wherein the selecting the first code is further responsive to a threshold number of memory cells to be programmed in the first write.

21. The method of claim 18, wherein the selecting the subsequent code is further responsive to a threshold number of memory cells to be programmed in the subsequent write.

22. The method of claim 18, wherein the memory page is on a not-and (NAND) flash memory device.

23. A system comprising:
a receiver for receiving write data and a write address of a memory page in a memory device, the memory page associated with a plurality of memory cells, the memory page being in one of an erased state and a previously written state, and the write data characterized by a data rate;
a first codeword generator for generating a first codeword in response to the memory page being in the erased state, the generating a first codeword comprising selecting a first code in response to the data rate and to a target number of memory cells to be programmed in a first write, and applying the first code to the write data to generate the first codeword; and
a subsequent codeword generator for generating a subsequent codeword in response to the memory page being in the previously written state, the generating a subsequent codeword comprising selecting a subsequent code in response to the data rate, to a target number of memory cells to be programmed in a subsequent write, to current contents of the memory cells, and to a constraint that any of the memory cells that are currently programmed in the memory page remain programmed when the subsequent code is applied to the write data, and applying the subsequent code to the write data to generate the subsequent codeword, thereby allowing the memory page to be written multiple times between erasures.

24. The system of claim 23, wherein the memory device is a single level cell not-and (NAND) memory device.

25. The system of claim 23, wherein the memory device is a multi-level cell NAND memory device.

* * * * *